(12) United States Patent
Kim et al.

(10) Patent No.: US 11,552,279 B2
(45) Date of Patent: Jan. 10, 2023

(54) DISPLAY DEVICE INCLUDING OPTICAL PATTERN LAYER ON FINGERPRINT SENSOR LAYER AND METHOD OF MANUFACTURING THE SAME

(71) Applicant: Samsung Display Co., Ltd., Yongin-si (KR)

(72) Inventors: Tae Sung Kim, Yongin-si (KR); Hyun Min Cho, Yongin-si (KR); Yun Jong Yeo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 41 days.

(21) Appl. No.: 16/900,294

(22) Filed: Jun. 12, 2020

(65) Prior Publication Data

US 2021/0159466 A1 May 27, 2021

(30) Foreign Application Priority Data

Nov. 22, 2019 (KR) ........................ 10-2019-0151657

(51) Int. Cl.
*H01L 51/52* (2006.01)
*H01L 27/32* (2006.01)
*H01L 51/56* (2006.01)

(52) U.S. Cl.
CPC ........ *H01L 51/5284* (2013.01); *H01L 27/323* (2013.01); *H01L 27/3227* (2013.01); *H01L 27/3272* (2013.01); *H01L 27/3276* (2013.01); *H01L 51/5246* (2013.01); *H01L 51/56* (2013.01); *H01L 2227/323* (2013.01); *H01L 2251/308* (2013.01)

(58) Field of Classification Search
CPC . H01L 51/5284; H01L 51/5246; H01L 51/56; H01L 27/3227; H01L 27/323; H01L 27/3272; H01L 27/3276
USPC .......................................................... 257/40
See application file for complete search history.

(56) References Cited

U.S. PATENT DOCUMENTS

| 10,268,884 B2 | 4/2019 | Jones et al. |
| 2018/0175125 A1* | 6/2018 | Chung ............... H01L 27/3234 |
| 2018/0265964 A1 | 9/2018 | Kato et al. |
| 2019/0310724 A1* | 10/2019 | Yeke Yazdandoost ...................... G02F 1/13338 |
| 2020/0104563 A1* | 4/2020 | Ryu ..................... G02B 6/0053 |
| 2020/0280015 A1* | 9/2020 | Odaka .................... H05B 33/22 |

FOREIGN PATENT DOCUMENTS

| KR | 10-2018-0100140 A | 9/2018 |
| KR | 10-2018-0106896 A | 10/2018 |
| KR | 10-1924916 B1 | 12/2018 |
| WO | WO 2017/129126 A1 | 8/2017 |

* cited by examiner

Primary Examiner — Matthew E. Gordon
(74) Attorney, Agent, or Firm — Lewis Roca Rothgerber Christie LLP

(57) ABSTRACT

A display device includes: a first substrate; a barrier layer on the first substrate; an optical pattern layer on the barrier layer, and including a light blocking pattern, and a plurality of light transmitting patterns penetrating the light blocking pattern in a first direction; a first thin film transistor layer on the optical pattern layer; a light emitting element layer on the first thin film transistor layer; and a fingerprint sensor layer underneath the first substrate to receive light reflected from an external object.

13 Claims, 18 Drawing Sheets

DISPLAY DEVICE INCLUDING OPTICAL PATTERN LAYER ON FINGERPRINT SENSOR LAYER AND METHOD OF MANUFACTURING THE SAME

CROSS-REFERENCE TO RELATED APPLICATION

This application claims priority to and the benefit of Korean Patent Application No. 10-2019-0151657, filed on, Nov. 22, 2019, the entire content of which is incorporated by reference herein.

BACKGROUND

1. Field

Aspects of example embodiments of the present disclosure relate to a display device and a method of manufacturing the same.

2. Description of the Related Art

As information society develops, demand for a display device for displaying an image is increasing in various forms. For example, the display device is applied to various electronic devices, such as a smart phone, a digital camera, a notebook computer, a navigation device, a smart television, and/or the like. The display device may be a flat panel display device, for example, such as a liquid crystal display device, a field emission display device, an organic light emitting display device, and/or the like.

The organic light emitting display device displays an image using an organic light emitting diode (OLED) that generates light by recombination of electrons and holes. The organic light emitting display device may have a fast response speed, a large luminance and/or a viewing angle, and low power consumption.

The above information disclosed in this Background section is for enhancement of understanding of the background of the present disclosure, and therefore, it may contain information that does not constitute prior art

SUMMARY

Recently, research and development have been conducted on a technology for integrating a sensor for fingerprint recognition in a display panel that occupies the largest area in the display device.

One or more example embodiments of the present disclosure are directed to a display device capable of reducing or minimizing damage to a substrate of the display device including a fingerprint sensor layer, and a method of manufacturing the same.

Aspects and features of the present disclosure are not limited to those described above, and these and other aspects and features may be clearly understood by those skilled in the art from the following description.

According to one or more example embodiments of the present disclosure, a display device includes: a first substrate; a barrier layer on the first substrate; an optical pattern layer on the barrier layer, and including a light blocking pattern, and a plurality of light transmitting patterns penetrating the light blocking pattern in a first direction; a first thin film transistor layer on the optical pattern layer; a light emitting element layer on the first thin film transistor layer; and a fingerprint sensor layer underneath the first substrate to receive light reflected from an external object.

In an example embodiment, one surface of the barrier layer may be in direct contact with the first substrate, and another surface of the barrier layer may be in direct contact with the light blocking pattern and the light transmitting pattern.

In an example embodiment, the barrier layer may include at least one of SiOx, SiNx, and SiON.

In an example embodiment, the barrier layer may include at least one of ITO, IZO, and IGZO.

In an example embodiment, an aspect ratio of the light transmitting pattern may be defined by a height of the light transmitting pattern divided by a line width of the light transmitting pattern, the line width of the light transmitting pattern corresponding to a length of the light transmitting pattern in a second direction crossing the first direction, and the aspect ratio may be greater than or equal to 7.

In an example embodiment, the fingerprint sensor layer may include: a second thin film transistor layer underneath the first substrate; a light receiving element layer electrically connected to the second thin film transistor layer; and a second thin film encapsulation layer covering the light receiving element layer.

In an example embodiment, the light receiving element layer may include: a first electrode electrically connected to the second thin film transistor layer; a second electrode on the first electrode to receive a common voltage; and a light receiving layer between the first electrode and the second electrode.

In an example embodiment, the light receiving layer may overlap with the light transmitting pattern in the first direction.

In an example embodiment, the light reflected from the external object may pass through the light transmitting pattern and the barrier layer to be provided to the light receiving layer.

In an example embodiment, the light receiving element layer may include a photo transistor or a photo diode.

In an example embodiment, the fingerprint sensor layer may be attached to a lower portion of the first substrate through a transparent adhesive member.

In an example embodiment, the display device may further include: a first thin film encapsulation layer on the light emitting element layer; and a cover window on the first thin film encapsulation layer.

In an example embodiment, the display device may further include: a touch sensing layer between the first thin film encapsulation layer and the cover window.

According to one or more example embodiments of the present disclosure, a method of manufacturing a display device, includes: providing an optical pattern layer on a first substrate; providing a display panel on the optical pattern layer; and providing a fingerprint sensor layer underneath the first substrate. The providing of the optical pattern layer includes: providing a first hard mask on the first substrate; providing a light transmitting material layer on the first substrate; providing a second hard mask on the light transmitting material layer; etching the light transmitting material layer to form a plurality of light transmitting patterns; and providing a light blocking material layer on the first substrate to form a light blocking pattern.

In an example embodiment, an opening portion of the first hard mask may overlap with the second hard mask.

In an example embodiment, the method may further include: removing the first hard mask and the second hard mask after forming the plurality of light transmitting patterns, and the light blocking pattern may be directly formed on the first substrate.

In an example embodiment, the light transmitting material layer and the light blocking material layer may include an organic material.

In an example embodiment, the light blocking material layer may include at least one of an organic light blocking material and a metal light blocking material.

In an example embodiment, the providing of the display panel may include: providing a first thin film transistor layer on the optical pattern layer; and providing a light emitting element layer on the first thin film transistor layer.

In an example embodiment, the providing of the fingerprint sensor layer may include: disposing a light receiving element to overlap with the light transmitting pattern.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
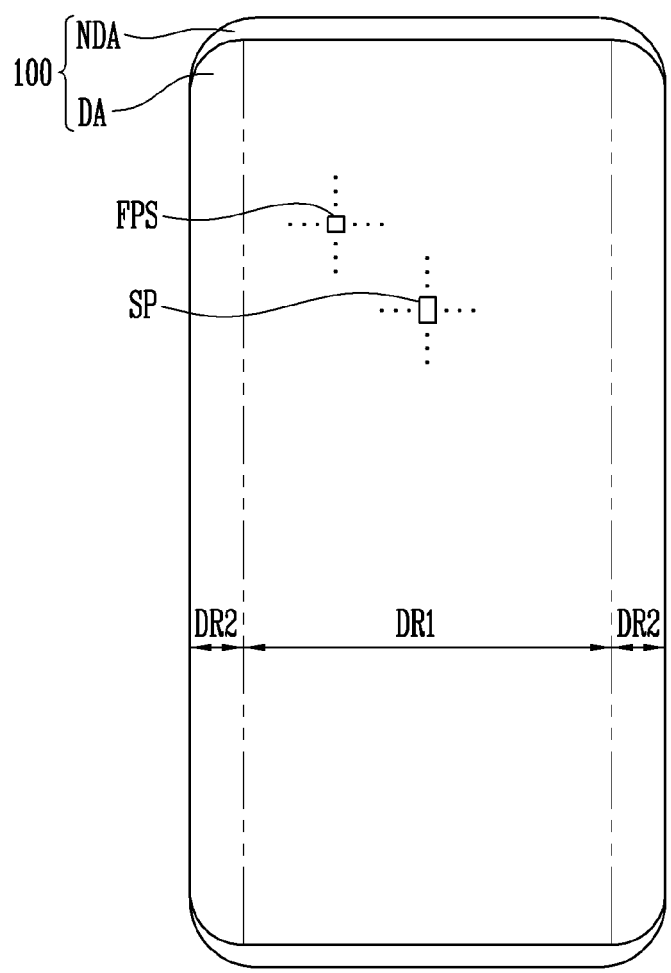
FIG. 1 is a plan view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Descriptions of features or aspects within each example embodiment should typically be considered as available for other similar features or aspects in other example embodiments. Further, each example embodiment may be implemented independently of each other or may be implemented together in association thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein FIG. 1 is a plan view of a display device according to an embodiment.

As used herein, the terms "upper portion", "top", "top surface", and "upper surface" indicate an upper direction, for example, a Z-axis direction with respect to a display device 10, and the terms "lower portion", "bottom", "bottom surface", and "lower surface" indicate a lower direction, for example, a direction opposite to the Z-axis direction with respect to the display device 10. Further, the terms "left" (e.g., a "left side"), "right" (e.g., a "right side"), "up" (e.g., an "upper side"), and "down" (e.g., a "lower side") indicate directions with respect to the display device 10 when viewed in a plan view. For example, the term "right" (e.g., "right side") may indicate an X-axis direction, the term "left" (e.g., "left side") may indicate a direction opposite to the X-axis direction, the term "up" (e.g., "upper side) may indicate a Y-axis direction, and the term "down" (e.g., "lower side") may indicate a direction opposite to the Y-axis direction.

Referring to FIG. 1, the display device 10 may display a moving image (e.g., a video) and/or a still image. The display device 10 may be used as a display screen for various devices and products, for example, such as a mobile phone, a smart phone, a tablet PC, a smart watch, a watch phone, a mobile terminal, an electronic notebook, an electronic book, a portable multimedia player (PMP), a navigation device, an ultra-mobile PC (UMPC), and/or the like, as well as a television, a notebook computer, a monitor, a billboard, Internet of things (IOT) devices, and/or the like.

The display device 10 may include a first region DR1 and a second region DR2. The first region DR1 may be formed to be flat or substantially flat, and the second region DR2 may extend from opposite sides (e.g., a left side and a right side) of the first region DR1. For example, the second region DR2 may be formed to be flat or substantially flat, or may be formed as a curved surface. When the second region DR2 is formed to be flat or substantially flat, an angle formed by (e.g., between) the first region DR1 and the second region DR2 may be an obtuse angle. When the second region DR2 is formed as the curved surface, the second region DR2 may have a constant curvature or may have a non-constant curvature (e.g., a changed curvature).

The second region DR2 may extend from each of the left and right sides of the first region DR1, but the present disclosure is not limited thereto. For example, the second region DR2 may extend from only one side from among the left and right sides of the first region DR1. In another example, the second region DR2 may extend from at least one from among an upper side and a lower side of the first region DR1, as well as from the left and right sides of the first region DR1.

The display device 10 includes a display panel 100 for displaying an image. The display panel 100 may include a display area DA and a non-display area NDA.

The display area DA may be an area for displaying an image, and may include a plurality of sub pixels SP. Further, the display area DA may be used as a detection member for detecting an external environment. For example, the display area DA may correspond to a fingerprint recognition area for recognizing a fingerprint of a user. Therefore, the display area DA may include a plurality of sub pixels SP and a plurality of fingerprint sensors FPS. The display area DA may be used as an area for displaying the image, and for recognizing the fingerprint of the user. For example, the display panel 100 on which the plurality of sub pixels SP are arranged and a fingerprint sensor layer on which the plurality of fingerprint sensors FPS are arranged may overlap with each other in a third direction (e.g., in the Z-axis direction).

The non-display area NDA may be defined as an area (e.g., a remaining area) of the display panel 100 other than the display area DA. For example, the non-display area NDA may surround (e.g., around a periphery of) the display area DA, or may be adjacent to at least one side (e.g., the upper side and the lower side in FIG. 1) of the display area DA. The non-display area NDA may be an area on which a driver and/or lines may be arranged. For example, the non-display area NDA may include a scan driver for applying scan signals to scan lines, fan out lines for connecting data lines to a display driver, and pads connected to a circuit board.

For example, the non-display area NDA may be formed to be opaque. The non-display area NDA may be formed as a decor layer at (e.g., in or on) which a pattern is formed. The pattern may be viewable by (e.g., displayed to or shown to) the user.

Figure 2:
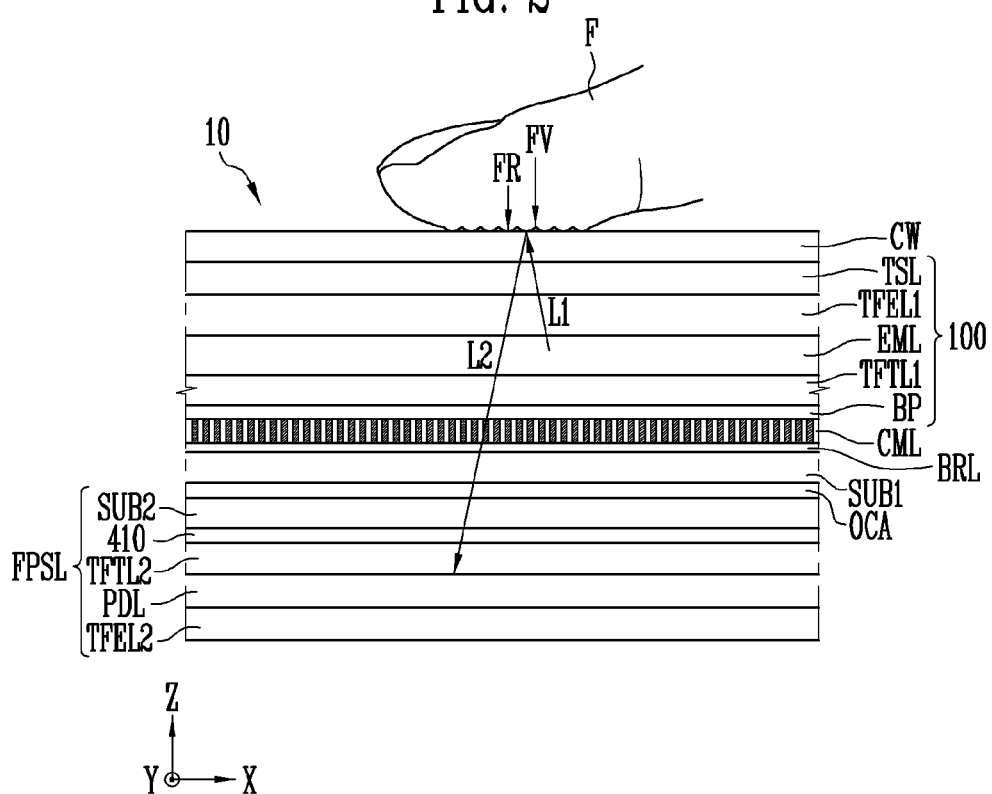
FIG. 2 is a cross-sectional view of the display device according to an embodiment.

FIG. 2 is a cross-sectional view of the display device according to an embodiment.

Referring to FIG. 2, the display device 10 may include a first substrate SUB1, a barrier layer BRL, an optical pattern layer CML, the display panel 100, a cover window CW, and a fingerprint sensor layer FPSL.

The first substrate SUB1 may be a base substrate, and may include (e.g., may be formed of) an insulating material, for example, such as a polymer resin. For example, the first substrate SUB1 may include (e.g., may be formed of) polyethersulfone (PES), polyacrylate (PAC), polyarylate (PAC), polyetherimide (PEI), polyethylene naphthalate (PEN), polyethylene terepthalate (PET), polyphenylene sulfide (PPS), polyarylate (PAR), polyimide (PI), polycarbonate (PC), cellulose triacetate (CTA), cellulose acetate propionate (CAP), and/or the like, or a combination thereof.

For example, the first substrate SUB1 may be a flexible substrate capable of being bent, folded, rolled, and/or the like. When the first substrate SUB1 is the flexible substrate, the first substrate SUB1 may be formed of a polyimide PI, but the present disclosure is not limited thereto.

The barrier layer BRL may cover an upper surface of the first substrate SUB1. The barrier layer BRL may protect the first substrate SUB1 during a process of forming the optical pattern layer CML, which may be described in more detail below.

One surface (e.g., a bottom surface) of the barrier layer BRL may be in contact (e.g., in direct contact) with the first substrate SUB1, and another surface (e.g., an upper surface) of the barrier layer BRL may be in contact (e.g., in direct contact) with the optical pattern layer CML.

The barrier layer BRL may include at least one inorganic film. For example, the barrier layer BRL may include an inorganic film, such as a silicon nitride layer, a silicon oxy nitride layer, a silicon oxide layer, a titanium oxide layer, and/or an aluminum oxide layer, but the present disclosure is not limited thereto.

The barrier layer BRL may include (e.g., may be formed of) a transparent or a semi-transparent conductive oxide. For example, the barrier layer BRL may include (e.g., may be formed of) at least one of indium tin oxide (ITO), indium zinc oxide (IZO), indium gallium zinc oxide (IGZO), indium zinc tin oxide (IZTO), aluminum zinc oxide (AZO), zinc oxide (ZnOx), indium oxide (InOx), tin oxide (SnOx), cadmium tin oxide (CTO), gallium-doped zinc oxide (GZO), zinc tin oxide (ZTO), and indium gallium oxide (IGO), but the present disclosure is not limited thereto.

The optical pattern layer CML may be disposed on the barrier layer BRL.

The optical pattern layer CML may serve to distinguish light reflected from a ridge FR from light reflected from a valley FV of a finger F of the user, and may provide the light reflected from the ridge FR and the light reflected from the valley FV to a separate light receiving element. For example, the optical pattern layer CML may include a light blocking pattern BA, and a plurality of light transmitting patterns TA penetrating the light blocking pattern BA.

The light blocking pattern BA may include at least one of an organic light blocking material and a metal light blocking material. For example, the organic light blocking material may include at least one of carbon black (CB) and titanium black (TiBK), but the present disclosure is not limited thereto. The metal light blocking material may include, for example, at least one of chromium, chromium oxide, and chromium nitride, but the present disclosure is not limited thereto.

The plurality of light transmitting patterns TA may define (e.g., may be) an optical path of second light L2, which may be generated by first light L1 emitted from a light emitting element layer EML that is reflected from a body (e.g., a finger) of the user, to be directed (e.g., to proceed) towards the fingerprint sensor layer FPSL. For example, each of the plurality of light transmitting patterns TA may correspond to a space (e.g., a hole or an opening) surrounded (e.g., around a periphery thereof) by (or enclosed by) the barrier layer BRL, an inner wall of the light blocking pattern BA, and a back plane BP.

The plurality of light transmitting patterns TA may not overlap with a plurality of thin film transistors of a first thin film transistor layer TFTL1, and the light blocking pattern BA may overlap with the plurality of thin film transistors of the first thin film transistor layer TFTL1. For example, the plurality of light transmitting patterns TA may be arranged along a first direction (e.g., the X-axis direction) and along a second direction (e.g., the Y-axis direction) crossing the first direction. A size of each of the light transmitting patterns TA may be determined according to a path of the second light L2.

The light blocking pattern BA and the light transmitting pattern TA will be described in more detail below with reference to FIGS. 3 to 7.

The display panel 100 may be disposed on the optical pattern layer CML.

The display panel 100 may include the back plane BP, the first thin film transistor layer TFTL1, the light emitting element layer EML, a first thin film encapsulation layer TFEL1, and the touch sensor layer TSL.

The back plane BP may be disposed on the optical pattern layer CML, and may support the first thin film transistor layer TFTL1. For example, the back plane BP may include (e.g., may be formed of) an insulating material such as a polymer resin.

For example, the back plane BP may be a flexible substrate capable of bending, folding, rolling, and/or the like. When the back plane BP is the flexible substrate, the back plane BP may include (e.g., may be formed of) polyimide PI, but the present disclosure is not limited thereto.

The first thin film transistor layer TFTL1 may be disposed on the back plane BP. The first thin film transistor layer TFTL1 may include at least one thin film transistor for driving each of the plurality of sub pixels SP.

At least one thin film transistor of the sub pixel SP may include a semiconductor layer, a gate electrode, a drain electrode, and a source electrode. For example, the first thin film transistor layer TFTL1 may further include scan lines, data lines, power lines, scan control lines, and/or the like, which may be connected to at least one thin film transistor of the sub pixel SP, and routing lines for connecting the pads and the data lines to each other.

The light emitting element layer EML may be disposed on the first thin film transistor layer TFTL1. The light emitting element layer EML may include a light emitting element connected to at least one thin film transistor of the first thin film transistor layer TFTL1.

The light emitting element may include a first electrode, a light emitting layer, and a second electrode. For example, the light emitting layer may be an organic light emitting layer including (e.g., formed of) an organic material, but the present disclosure is not limited thereto. In a case where the light emitting layer corresponds to the organic light emitting layer, when the thin film transistor of the first thin film transistor layer TFTL1 applies a suitable or desired voltage (e.g., a predetermined voltage) to the first electrode of the light emitting element and the second electrode of the light emitting element receives a common voltage or a cathode voltage, the light emitting element may emit light. For example, each of holes and electrons may move to the organic light emitting layer through a hole transport layer and an electron transport layer, and the holes and the electrons may combine with each other in the organic light emitting layer to emit light.

The light emitting element layer EML may include a pixel definition film for defining the plurality of sub pixels SP. In this case, the first electrode and the light emitting layer of the light emitting element may be spaced apart from each other and insulated from each other by the pixel definition film.

The first thin film encapsulation layer TFEL1 may be disposed on the light emitting element layer EML, to cover the first thin film transistor layer TFTL1 and the light emitting element layer EML.

The first thin film encapsulation layer TFEL1 may prevent or substantially prevent oxygen and/or moisture from penetrating into the light emitting element layer EML. Accordingly, in an embodiment, the first thin film encapsulation layer TFEL1 may include at least one inorganic film. For example, the first thin film encapsulation layer TFEL1 may include an inorganic film, such as a silicon nitride layer, a silicon oxy nitride layer, a silicon oxide layer, a titanium oxide layer, and/or an aluminum oxide layer, but the present disclosure is not limited thereto.

The first thin film encapsulation layer TFEL1 may protect the light emitting element layer EML from a foreign substance, for example, such as dust. Accordingly, in an embodiment, the first thin film encapsulation layer TFEL1 may include at least one organic film. For example, the first thin film encapsulation layer TFEL1 may include an organic film, such as an acrylic resin, an epoxy resin, a phenol resin, a polyamide resin, and/or a polyimide resin, but the present disclosure is not limited thereto.

The touch sensor layer TSL may be disposed on the first thin film encapsulation layer TFEL1. In an embodiment, the touch sensor layer TSL may be directly disposed on the first thin film encapsulation layer TFEL1. In this case, a thickness of the display device 10 may be reduced when compared with a case where a separate touch panel including the touch sensor layer TSL is attached on the first thin film encapsulation layer TFEL1.

The touch sensor layer TSL may include touch electrodes for sensing a touch of the user, and touch electrode lines for connecting the pads and the touch electrodes to each other. The touch electrodes of the touch sensor layer TSL may be disposed at (e.g., in or on) a touch sensing region overlapping with the display area DA of the display panel 100.

The cover window CW may be disposed on the display panel 100.

The cover window CW may be disposed on the touch sensor layer TSL of the display panel 100. For example, the cover window CW may be attached on the touch sensor layer TSL by a transparent adhesive member. In an embodiment, the cover window CW may include a touch surface (e.g., a top surface) that directly contacts the finger F of the user.

The fingerprint sensor layer FPSL may be disposed under (e.g., underneath) the first substrate SUB1. A first surface (e.g., an upper surface or one surface) of the first substrate SUB1 may face the barrier layer BRL, and a second surface (e.g., a lower surface or another surface) of the first substrate SUB1 may face the fingerprint sensor layer FPSL. For example, an upper surface of the fingerprint sensor layer FPSL may be attached to the lower surface of the first substrate SUB1 by a transparent adhesive member, for example, such as an optically clear adhesive (OCA).

The fingerprint sensor layer FPSL may include a plurality of fingerprint sensors FPS (e.g., as shown in FIG. 1).

The plurality of fingerprint sensors FPS may be optical fingerprint sensors. For example, the plurality of fingerprint sensors FPS may include (e.g., may be formed of) a photo diode, a CMOS image sensor, a CCD camera, a photo transistor, and/or the like, but the present disclosure is not limited thereto.

The plurality of fingerprint sensors FPS may recognize the fingerprint of the user by sensing the light reflected by the ridge FR, and the valley FV between the ridges FR, of the finger F.

For example, when the finger F of the user contacts the cover window CW, the first light L1 output from the light emitting element layer EML may be reflected by the ridge FR and/or the valley FV of the finger F. The reflected second light L2 may pass through (e.g., may be transmitted through) the light transmitting pattern TA of the optical pattern layer CML and through the barrier layer BRL, and may reach (e.g., may be incident on) the fingerprint sensor layer FPSL disposed under (e.g., underneath) the first substrate SUB1. The fingerprint sensors FPS of the fingerprint sensor layer FPSL may distinguish the light reflected from the ridge FR of the finger F and the light reflected from the valley FV of the finger F from each other, to recognize a pattern of the fingerprint of the user. Therefore, the light transmitting pattern TA of the optical pattern layer CML may define (e.g., may be) the path for the second light L2 reflected by the finger F of the user.

The display device 10 may simplify a manufacturing process thereof by including the fingerprint sensor layer FPSL that is disposed under (e.g., underneath) the display panel 100. In this case, because the fingerprint sensors FPS of the fingerprint sensor layer FPSL are not disposed on a path (e.g., an upper surface of the light emitting layer EML) through which the first light L1 is output (e.g., towards which the first light L1 is emitted), a reduction of a resolution of the display device 10 may be prevented or reduced.

The fingerprint sensor layer FPSL may include a second substrate SUB2, a buffer layer 410, a second thin film transistor layer TFTL2, a light receiving element layer PDL, and a second thin film encapsulation layer TFEL2.

The second substrate SUB2 may be attached to a lower portion (e.g., the lower surface) of the first substrate SUB1 through an adhesive member OCA. An upper surface (e.g., one surface) of the second substrate SUB2 may face the lower surface (e.g., the other surface) of the first substrate SUB1. For example, the adhesive member OCA may be an optical clear adhesive member, but the present disclosure is not limited thereto. The upper surface (e.g., the one surface) of the second substrate SUB2 may be attached to the lower surface (e.g., the other surface) of the first substrate SUB1 by the adhesive member OCA.

The second substrate SUB2 may be a base substrate, and may include (e.g., may be formed of) an insulating material, for example, such as a polymer resin. For example, the second substrate SUB2 may be a flexible substrate capable of bending, folding, rolling, and/or the like. When the second substrate SUB2 is the flexible substrate, the second substrate SUB2 may be formed of polyimide PI, but the present disclosure is not limited thereto.

The buffer layer 410 may be disposed on a lower surface (e.g., another surface) of the second substrate SUB2. The buffer layer 410 may include (e.g., may be formed of) an inorganic film capable of preventing or substantially preventing penetration of air and/or moisture. For example, the buffer layer 410 may include (e.g., may be formed of) multiple films in which at least one inorganic film such as a silicon nitride layer, a silicon oxy nitride layer, a silicon oxide layer, a titanium oxide layer, and/or an aluminum oxide layer, is alternately stacked, but the present disclosure is not limited thereto.

The second thin film transistor layer TFTL2 may be disposed on a lower surface (e.g., another surface) of the second substrate SUB2 or of the buffer layer 410. An upper surface (e.g., one surface) of the second thin film transistor layer TFTL2 may face the lower surface (e.g., the other surface) of the buffer layer 410.

The second thin film transistor layer TFTL2 may include at least one thin film transistor for driving each of the plurality of fingerprint sensors FPS. At least one thin film transistor of the fingerprint sensor FPS may include a semiconductor layer, a gate electrode, a drain electrode, and a source electrode. For example, the second thin film transistor layer TFTL2 may further include scan lines, read out lines, and common voltage lines that are connected to at least one thin film transistor of the fingerprint sensor FPS.

The light receiving element layer PDL may be disposed on a lower surface (e.g., another surface) of the second thin film transistor layer TFTL2. An upper surface (e.g., one surface) of the light receiving element layer PDL may face the lower surface (e.g., the other surface) of the second thin film transistor layer TFTL2.

The light receiving element layer PDL may include a light receiving element connected to at least one thin film transistor of the second thin film transistor layer TFTL2. The light receiving element may include a first electrode, a light receiving layer, and a second electrode. For example, the light receiving layer may be an organic light receiving layer formed of an organic material, but the present disclosure is not limited thereto. When the light receiving layer corresponds to the organic light receiving layer, the organic light receiving layer may receive the second light L2 to combine holes and electrons, and may convert energy of the second light L2 into an electrical signal (e.g., a current or a voltage) formed between the first electrode and the second electrode.

The light receiving element layer PDL may include a sensor definition film for defining the plurality of fingerprint sensors FPS. The first electrode and the light receiving layer of the light receiving element may be spaced apart from each other, and may be insulated from each other by the sensor definition film.

The second thin film encapsulation layer TFEL2 may be disposed on a lower surface (e.g., another surface) of the light receiving element layer PDL. An upper surface (e.g., one surface) of the second thin film encapsulation layer TFEL2 may face the lower surface (e.g., the other surface) of the light receiving element layer PDL.

The second thin film encapsulation layer TFEL2 may cover the lower surface of the light receiving element layer PDL, and may prevent or substantially prevent oxygen and/or moisture from penetrating into the light receiving element layer PDL. For example, the second thin film encapsulation layer TFEL2 may include at least one inorganic film. The second thin film encapsulation layer TFEL2 may include an inorganic film, for example, such as a silicon nitride layer, a silicon oxy nitride layer, a silicon oxide layer, a titanium oxide layer, and/or an aluminum oxide layer, but the present disclosure is not limited thereto.

The second thin film encapsulation layer TFEL2 may protect the light receiving element layer PDL from a foreign substance, for example, such as dust. For example, the second thin film encapsulation layer TFEL2 may include at least one organic film. The second thin film encapsulation layer TFEL2 may include an organic film, for example, such as an acrylic resin, an epoxy resin, a phenol resin, a polyamide resin, and/or a polyimide resin, but the present disclosure is not limited thereto.

While, FIG. 2 illustrates a case where the second substrate SUB2 of the fingerprint sensor layer FPSL is disposed to face the third direction (e.g., the Z-axis direction), the present disclosure is not limited thereto. For example, the second thin film encapsulation layer TFEL2 of the fingerprint sensor layer FPSL may be disposed to face the third direction (e.g., Z-axis direction). In this case, the second thin film encapsulation layer TFEL2 of the fingerprint sensor layer FPSL may be attached to the first substrate SUB1, or may further include a separate substrate to be attached to the first substrate SUB1 through the separate substrate.

Figure 3:
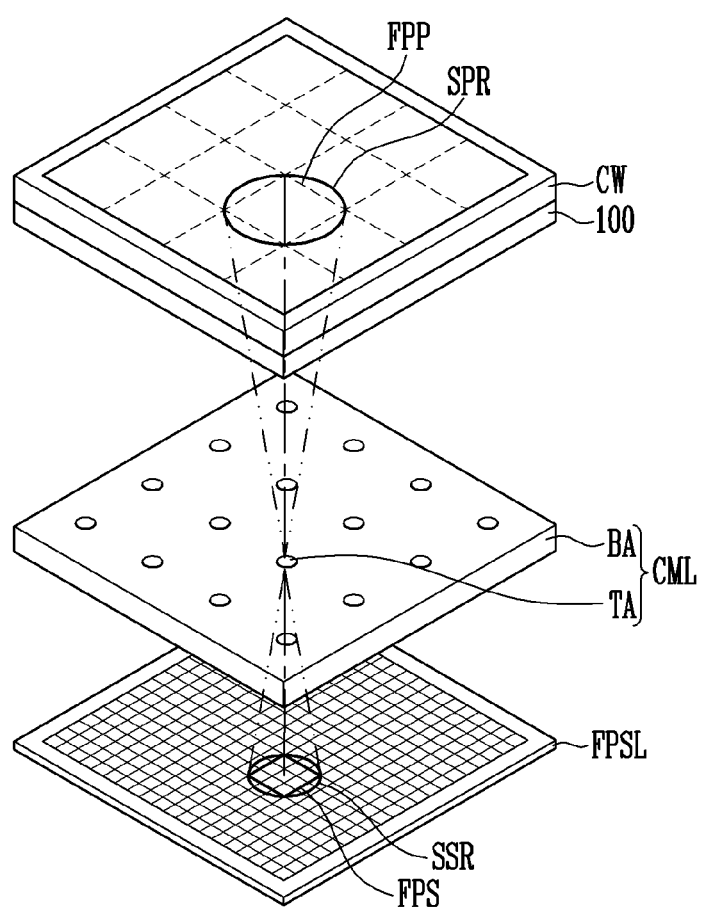
FIG. 3 is a perspective view illustrating a path of reflected light in the display device according to an embodiment.
Figure 4:
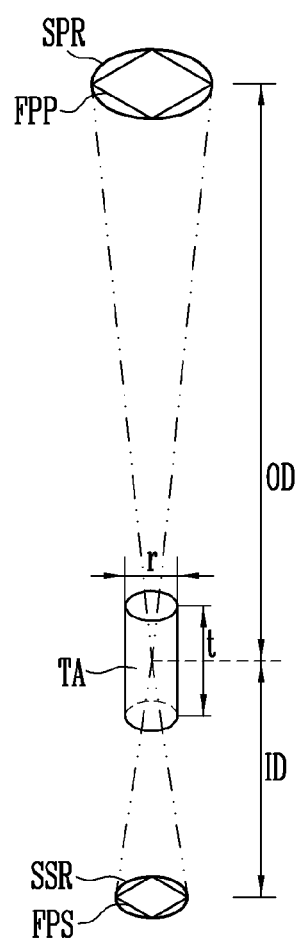
FIG. 4 is a diagram illustrating a fingerprint pixel and a sensor pixel of the display device according to an embodiment.

FIG. 3 is a perspective view illustrating a path of reflected light in the display device according to an embodiment. FIG. 4 is a diagram illustrating a fingerprint pixel and a sensor pixel of the display device according to an embodiment.

Referring to FIGS. 3 and 4, the cover window CW may include a plurality of fingerprint pixels FPP, and a sampling region SPR surrounding (e.g., around a periphery of) each of the plurality of fingerprint pixels FPP. The fingerprint sensor layer FPSL may include a plurality of fingerprint sensors FPS, and a sensing region SSR surrounding (e.g., around a periphery of) each of the plurality of fingerprint sensors FPS.

One fingerprint pixel FPP on the cover window CW may correspond to at least one fingerprint sensor FPS of the fingerprint sensor layer FPSL. For example, one fingerprint pixel FPP may correspond to about 20 to 30 fingerprint sensors FPS, but the present disclosure is not limited thereto. The sampling region SPR on the cover window CW may correspond to the sensing region SSR of the fingerprint sensor layer FPSL.

Each of the plurality of fingerprint pixels FPP may correspond to a light transmitting pattern (e.g., one light transmitting pattern) TA of the optical pattern layer CML. For example, when the finger F of the user contacts the cover window CW, a plurality of sampling regions SPR may reflect the first light L1 output (e.g., emitted) from the display panel 100 as the second light L2. The second light L2 reflected from each of the plurality of sampling regions SPR may pass through the light transmitting pattern TA of the optical pattern layer CML, and may reach (e.g., may be incident on) the sensing region SSR of the fingerprint sensor layer FPSL.

The plurality of light transmitting patterns TA of the optical pattern layer CML may define (e.g., may be) a path for the second light L2 reflected by the finger F of the user. Therefore, the plurality of fingerprint sensors FPS may sense the second light L2 reflected by the ridge FR of the finger F that is in contact with the sampling region SPR on the cover window CW, and the valley FV of the finger F between the ridges FR.

The display device 10 may sense the light reflected by the finger F of the user through the fingerprint sensor FPS according to a ratio of a fingerprint distance OD and a sensor distance ID. The fingerprint distance OD may correspond to a distance between a surface of the cover window CW on which the finger F of the user is directly contacting and a center point of the light transmitting pattern TA of the optical pattern layer CML. The sensor distance ID may correspond to a distance between the center point of the light transmitting pattern TA of the optical pattern layer CML and the fingerprint sensor FPS of the fingerprint sensor layer FPSL. For example, light reflected from an end (e.g., one end) of the fingerprint pixel FPP on the cover window CW may pass through the center point of the light transmitting pattern TA to reach an opposite end of the fingerprint sensor FPS. In addition, light reflected from an opposite end of the fingerprint pixel FPP on the cover window CW may pass through the center point of the light transmitting pattern TA to reach an end (e.g., one end) of the fingerprint sensor FPS. Therefore, a shape of the fingerprint that directly contacts the fingerprint pixel FPP, and an image of the fingerprint formed on the fingerprint sensor FPS may have a difference from each other of 180 degrees.

The light transmitting pattern TA may be formed to have a high aspect ratio in order to distinguish the light reflected from the ridge FR of the finger F of the user from the light reflected from the valley FV of the finger F of the user, and to provide the light reflected from the ridge FR and the light reflected from the valley FV to a separate fingerprint sensor FPS. For example, the aspect ratio of the light transmitting pattern TA may be represented by Equation 1 below, and in an embodiment, may have a value greater than or equal to 7.

$$\text{Aspect ratio of light transmitting pattern TA} = \text{height } t \text{ of light transmitting pattern TA/line width } r \text{ of light transmitting pattern TA (e.g., } t/r\text{).}$$

In Equation 1, the line width r of the light transmitting pattern TA may refer to a length of the transmitting pattern TA extending in the first direction (e.g., the X-axis direction) or in the second direction (e.g., the Y-axis direction).

Figure 5:
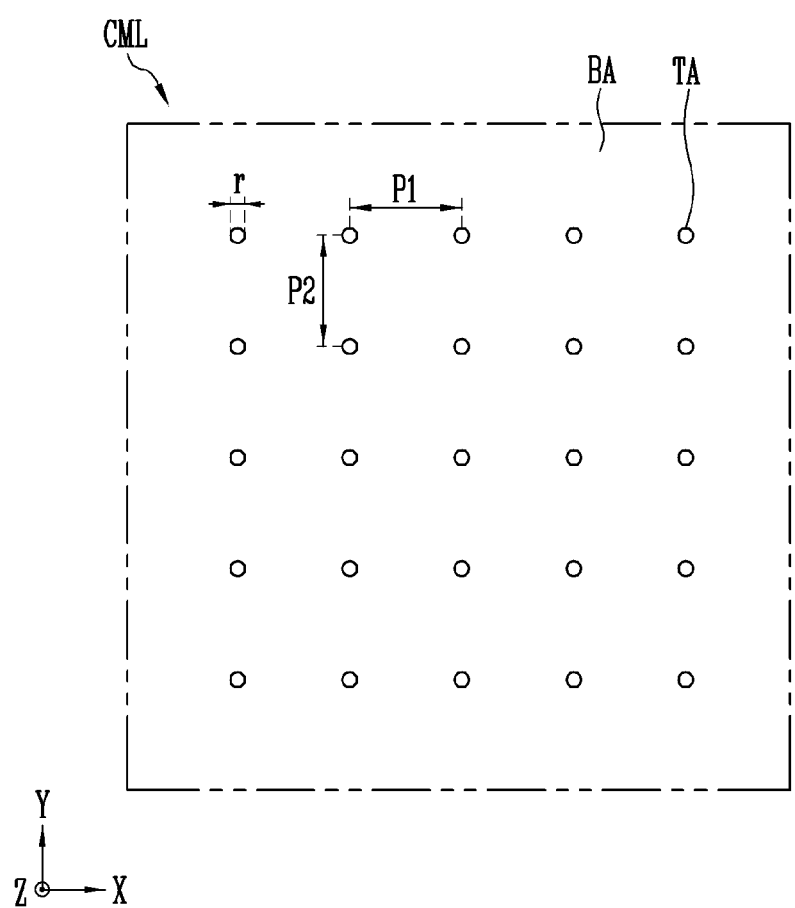
FIG. 5 is a plan view illustrating an example of an optical pattern layer of the display device according to an embodiment.

FIG. 5 is a plan view illustrating an example of the optical pattern layer of the display device according to an embodiment.

Referring to FIG. 5, the optical pattern layer CML may include the plurality of light transmitting patterns TA. For example, in an embodiment, a planar shape (e.g., a shape in a plan view) of the plurality of light transmitting patterns TA may correspond to a circle. The line width (e.g., a diameter) r of each of the light transmitting patterns TA may be 3 to 20 μm, but the present disclosure is not limited thereto.

The plurality of light transmitting patterns TA may be arranged to have a first pitch P1 in the first direction (e.g., the X-axis direction). For example, the first pitch P1 may be 1.3 to 1.5 times the sensor distance ID, and in an embodiment, the first pitch P1 may be 1.3 times the sensor distance ID.

The plurality of light transmitting patterns TA may be arranged to have a second pitch P2 in the second direction (e.g., the Y-axis direction). For example, the second pitch P2 may be the same or substantially the same as (e.g., may be equal to or substantially equal to) the first pitch P1. However, the present disclosure is not limited thereto, and in another example, the second pitch P2 may be different from the first pitch P1.

For example, the plurality of light transmitting patterns TA may be arranged side by side along the first direction (e.g., the X-axis direction), and along the second direction (e.g., the Y-axis direction). However, the present disclosure is not limited thereto, and in another example, the plurality of light transmitting patterns TA may be arranged along the first pitch P1 and the second pitch P2, and may be aligned in a direction other than the first direction (e.g., the X-axis direction) and the second direction (e.g., the Y-axis direction).

For example, the first pitch P1 and/or the second pitch P2 may be proportional to a thickness (e.g., in the Z-axis direction) of the first thin film encapsulation layer TFEL1. When the thickness of the first thin film encapsulation layer TFEL1 increases, the fingerprint distance OD may also increase, and thus, the area of the fingerprint pixel FPP and the sampling region SPR may also increase. Therefore, the first pitch P1 and/or the second pitch P2 of the plurality of light transmitting patterns TA may be proportional to the thickness of the first thin film encapsulation layer TFEL1 in order to adjust the ratio of the fingerprint distance OD and the sensor distance ID.

For example, the first pitch P1 and/or the second pitch P2 may be proportional to a distance between the light emitting elements of the light emitting element layer EML, or a distance between the sub pixels SP. As the distance between the light emitting elements increases, a distance between the second lights L2 reflected by the finger F may also increase. Therefore, the first pitch P1 and/or the second pitch P2 may be proportional to the distance between the light emitting elements or the distance between the sub pixels SP, so that the plurality of light transmitting patterns TA may define (e.g., may act as) the path for the second light L2.

Figure 6:
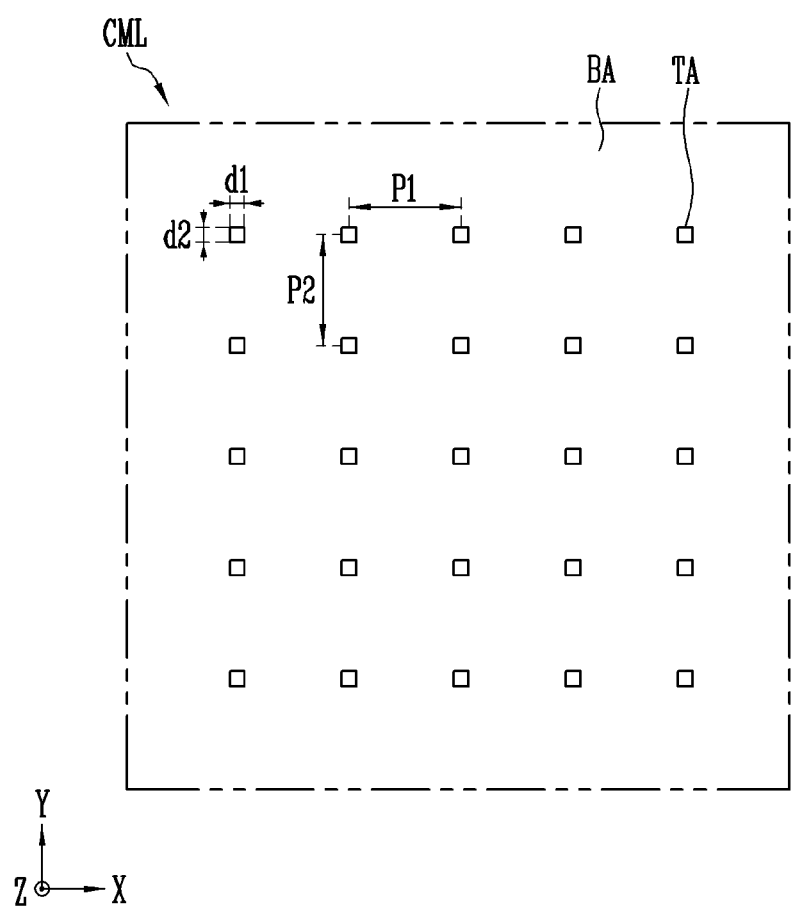
FIG. 6 is a plan view illustrating another example of the optical pattern layer of the display device according to an embodiment.

FIG. 6 is a plan view illustrating another example of the optical pattern layer of the display device according to an embodiment. The light transmitting pattern TA of FIG. 6 may be the same or substantially the same as the light transmitting pattern TA described with reference to FIG. 5, but may have a different shape from that of the light transmitting pattern TA of FIG. 5. Accordingly, redundant description of the same or substantially the same configuration as that of one or more of the above-described configurations may be simplified or may not be repeated.

Referring to FIG. 6, the planar shape (e.g., the shape in a plan view) of the plurality of light transmitting patterns TA may correspond to a quadrangle (e.g., a square). Each of the plurality of light transmitting patterns TA may have a first length d1 in the first direction (e.g., the X-axis direction), and a second length d2 in the second direction (e.g., the Y-axis direction). For example, the first length d1 of each of the plurality of light transmitting patterns TA may be 3 to 20 μm, but the present disclosure is not limited thereto. For example, the second length d2 of each of the plurality of light transmitting patterns TA may be the same or substantially the same as (e.g., may be equal to or substantially equal to) the first length d1, but the present disclosure is not limited thereto. In another embodiment, for example, the second length d2 of each of the plurality of light transmitting patterns TA may be different from the first length d1.

On the other hand, the shape (e.g., the planar shape) of the plurality of light transmitting patterns TA is not limited to the circle or the quadrangle shown in FIGS. 5 and 6. For example, the plurality of light transmitting patterns TA may be formed to have various suitable shapes (e.g., planar shapes), such as an ellipse, other various suitable polygons, and/or the like. In an embodiment, the plurality of light transmitting patterns TA may have different shapes from each other in the optical pattern layer CML.

According to one or more of the above-described embodiments, the display device 10 may improve sensitivity of the fingerprint sensor FPS by adjusting the ratio of the fingerprint distance OD and the sensor distance ID, and/or adjusting the arrangement and/or the shape of the light transmitting pattern TA of the optical pattern layer CML.

Figure 7:
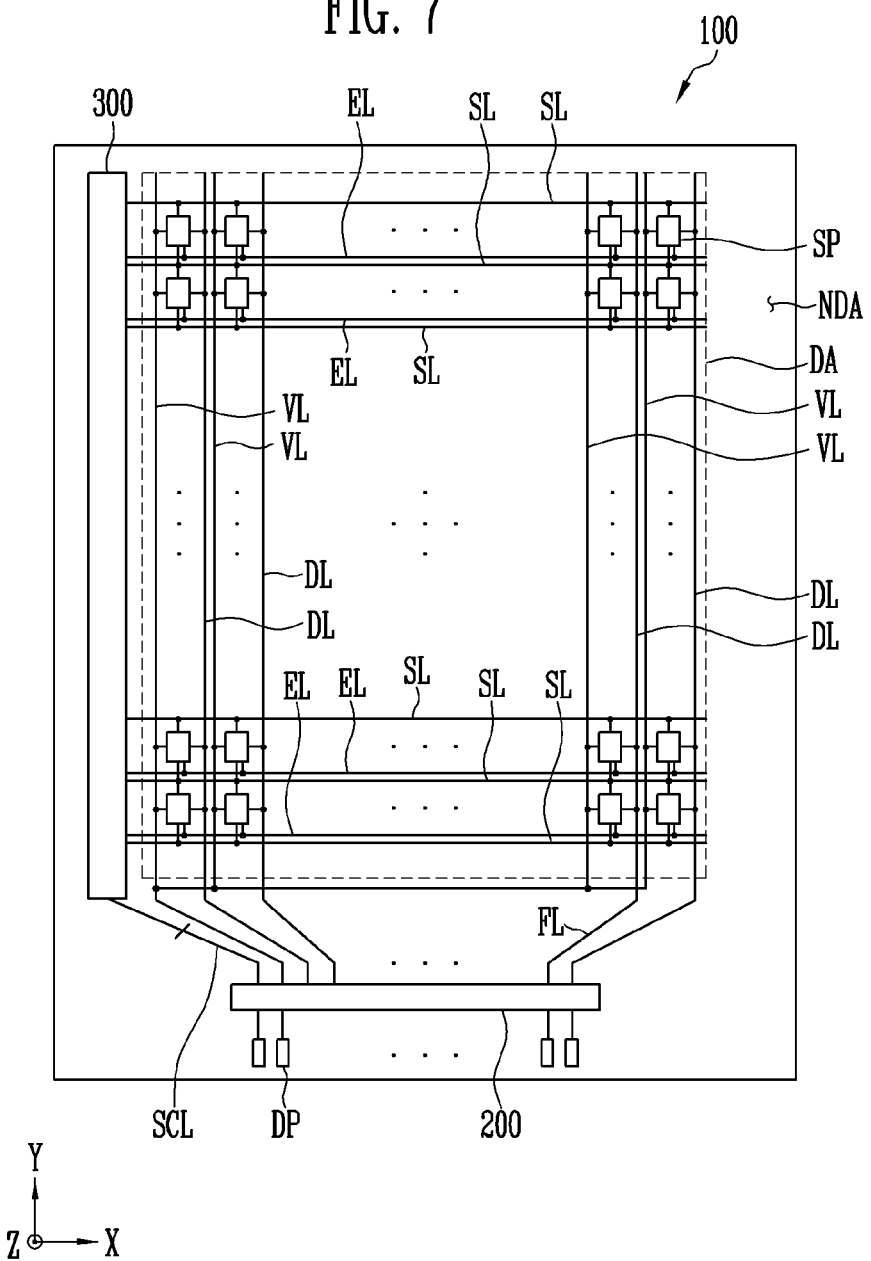
FIG. 7 is a diagram illustrating a connection relationship between sub pixels and lines of the display device according to an embodiment.

FIG. 7 is a diagram illustrating a connection relationship between the sub pixels and the lines of the display device according to an embodiment.

Referring to FIG. 7, the display panel 100 may include the display area DA, and the non-display area NDA.

The display area DA may include a plurality of sub pixels SP, voltage supply lines VL connected to the sub pixels SP, scan lines SL, emission lines EL, and data lines DL.

Each of the sub pixels SP may be connected to at least one scan line SL, at least one data line DL, at least one emission line EL, and at least one voltage supply line VL. FIG. 7 shows that each of the sub pixels SP may be connected to two scan lines SL, one data line DL, one emission line EL, and one voltage supply line VL, but the present disclosure is not limited thereto. For example, in another embodiment, each of the sub pixels SP may be connected to three or more scan lines SL.

Each of the sub pixels SP may include a driving transistor, at least one switching transistor, a light emitting element, and a capacitor.

The driving transistor may supply a driving current to the light emitting element according to a data voltage applied to a gate electrode of the driving transistor, and the light emitting element may emit light according to the driving current. In an embodiment, the driving transistor and the at least one switching transistor may be, for example, thin film transistors.

The light emitting element may emit light having a desired luminance (e.g., a predetermined luminance) according to a magnitude of the driving current supplied by the driving transistor. For example, the light emitting element may be an organic light emitting diode (OLED) including a first electrode, an organic light emitting layer, and a second electrode. The capacitor may maintain or substantially maintain (e.g., may constantly maintain) the data voltage applied to the gate electrode of the driving transistor to be constant or substantially constant.

The sub pixels SP may receive a driving voltage VDD through the voltage supply lines VL. For example, the driving voltage VDD may be a high potential voltage for driving the light emitting elements of the sub pixels SP.

The plurality of voltage supply lines VL may be spaced apart from each other along the first direction (e.g., the X-axis direction), and may extend in the second direction (e.g., the Y-axis direction). For example, each of the plurality of voltage supply lines VL may be disposed to extend along a column of sub pixels SP disposed at (e.g., in or on) the display area DA. Each of the plurality of voltage supply lines VL may be connected to the sub pixels SP that are disposed at (e.g., in or on) the same column, and may supply the driving voltage VDD to the sub pixels SP connected thereto.

The scan lines SL and the emission lines EL may extend in the first direction (e.g., the X-axis direction), and may be spaced apart from each other along the second direction (e.g., the Y-axis direction) crossing the first direction (e.g., the X-axis direction). The scan lines SL and the emission lines EL may be formed to be parallel or substantially parallel with each other.

The data lines DL may be spaced apart from each other along the first direction (e.g., the X-axis direction), and may extend in the second direction (e.g., the Y-axis direction). The data lines DL may be formed to be parallel or substantially parallel with the voltage supply line VL.

The non-display area NDA may include a scan driver 300 for applying scan signals to the scan lines SL, fan out lines FL for connecting the data lines DL and a display driver 200 to each other, and pads DP that are connected to a circuit board. The pads DP may be disposed to be closer to one side edge of the display panel 100 than to the display driver 200.

The display driver 200 may be connected to the pads DP to receive video data (e.g., digital video data) and timing signals. The display driver 200 may convert the video data (e.g., the digital video data) into data voltages (e.g., analog positive/negative polarity data voltages), and may supply the data voltages (e.g., the analog positive/negative polarity data voltages) to the data lines DL through the fan out lines FL.

The display driver 200 may generate a scan control signal, and may supply the scan control signal to the scan driver 300 through the scan control lines SCL.

The scan driver 300 may be disposed at (e.g., in or on) one side of the non-display area NDA. The scan driver 300 may include a plurality of thin film transistors for generating the scan signals according to the scan control signal. The scan driver 300 may supply the scan signals to the sub pixels SP according to (e.g., based on) the scan control signal to select the sub pixels SP to which the data voltages are to be supplied.

Figure 8:
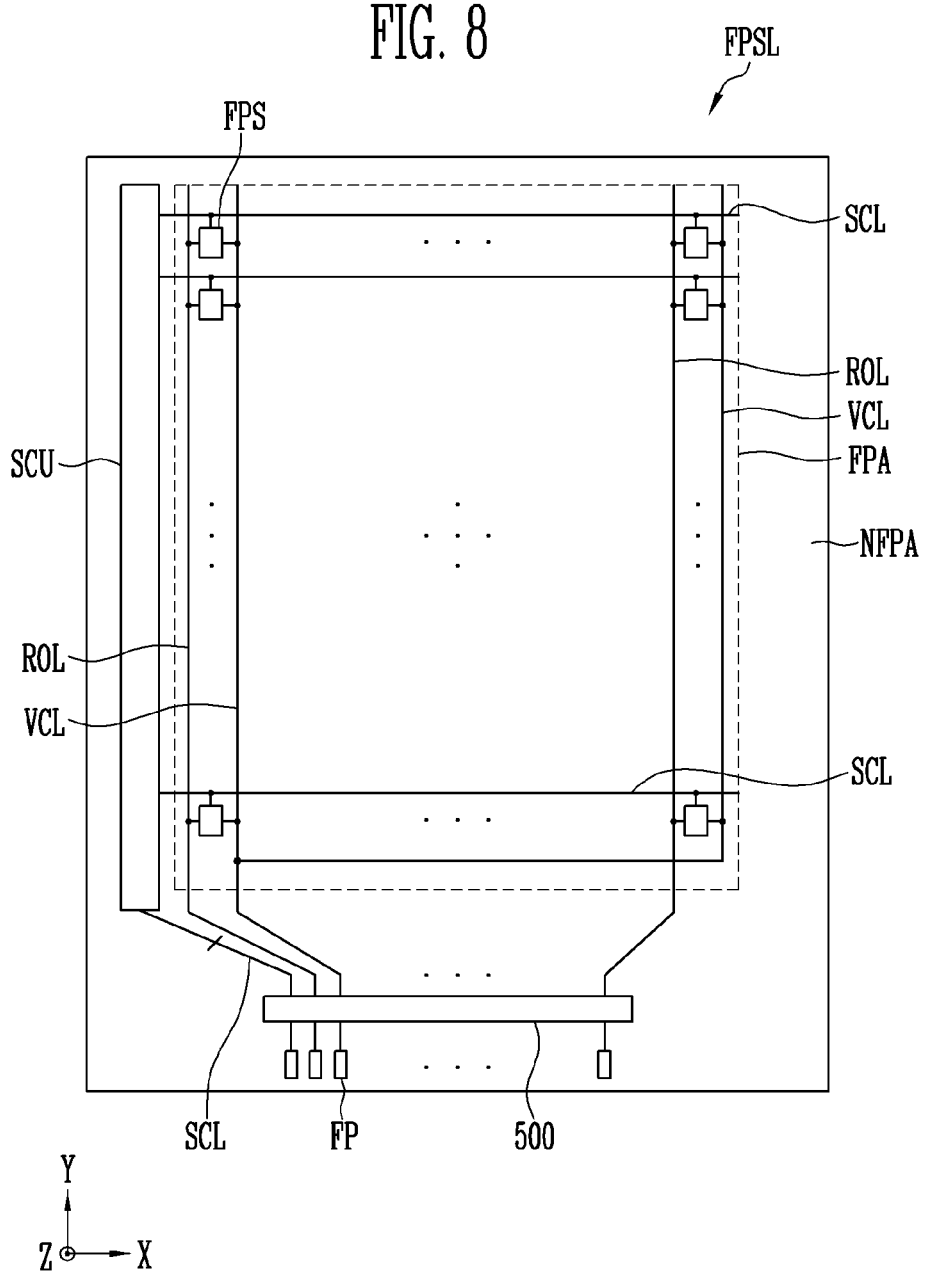
FIG. 8 is a diagram illustrating a connection relationship between fingerprint sensors and the lines of the display device according to an embodiment.

FIG. 8 is a diagram illustrating a connection relationship between the fingerprint sensors and the lines of the display device according to an embodiment.

Referring to FIG. 8, the fingerprint sensor layer FPSL may include a fingerprint recognition area FPA, and a non-fingerprint recognition area NFPA.

The fingerprint recognition area FPA may include a plurality of fingerprint sensors FPS, a plurality of scan lines SCL connected to the fingerprint sensors FPS, a plurality of read out lines ROL, and a plurality of common voltage lines VCL. For example, in an embodiment, a separation distance of each of the plurality of fingerprint sensors FPS may be 5 to 50 μm, and one fingerprint pixel on the cover window CW may correspond to 20 to 30 fingerprint sensors FPS of the fingerprint sensor layer FPSL, but the present disclosure is not limited thereto.

Each of the plurality of fingerprint sensors FPS may be connected to a scan driver SCU through one or more of the scan lines SCL, and may receive a scan signal from the scan driver SCU. The scan lines SCL may extend in the first direction (e.g., the X-axis direction), and may be spaced apart from each other along the second direction (e.g., the Y-axis direction). The scan driver SCU may select the fingerprint sensors FPS to sense a change in a read out signal by supplying the scan signal to each of the plurality of fingerprint sensors FPS.

Each of the plurality of fingerprint sensors FPS may be connected to a sensor driver 500 through the read out lines ROL, and may supply the read out signal to the sensor driver 500. The read out lines ROL may be spaced apart from each other along the first direction (e.g., the X-axis direction), and may extend in the second direction (e.g., the Y-axis direction).

The non-fingerprint recognition area NFPA may be disposed outside the fingerprint recognition area FPA. The non-fingerprint recognition area NFPA may be defined as areas other than the fingerprint recognition area FPA. For example, the scan driver SCU may be disposed at one side of the non-fingerprint recognition area NFPA, and may be connected to the scan lines SCL extending to the fingerprint recognition area FPA.

The sensor driver 500 may be disposed at (e.g., in or on) another side of the non-fingerprint recognition area NFPA. For example, the sensor driver 500 may be disposed at a side of the non-fingerprint recognition area NFPA that is perpendicular to or substantially perpendicular to the one side of the non-fingerprint recognition area NFPA, and may be connected to the read out lines ROL extending to the fingerprint recognition area NFPA. The sensor driver 500 may supply a sensing driving voltage to the plurality of fingerprint sensors FPS, and may recognize the pattern of the user fingerprint by receiving the read out signal by the touch of the finger F of the user.

For example, when the finger F of the user contacts (e.g., touches) the cover window CW, the read out signal of the fingerprint sensor FPS that receives (e.g., that is selected by) the scan signal may be changed. The read out signal of the fingerprint sensor FPS that receives the light (e.g., the second light L2) reflected by the ridge FR of the finger F may be different from the read out signal of the fingerprint sensor FPS that receives the light (e.g., the second light L2) reflected by the valley FV of the finger F. The sensor driver 500 may distinguish a difference between the read out signals to determine whether the ridge FR or the valley FV of the finger F is in contact with the fingerprint pixel of the cover window CW corresponding to the fingerprint sensor FPS. Therefore, the sensor driver 500 may recognize the pattern of the fingerprint of the user according to (e.g., based on) the read out signal.

The non-fingerprint recognition area NFPA may further include fingerprint recognition pads FP disposed at one side edge of the fingerprint sensor layer FPSL. The fingerprint recognition pads FP may be connected to the sensor driver 500, and may supply a signal applied from an external integrated circuit to the sensor driver 500.

Figure 9:
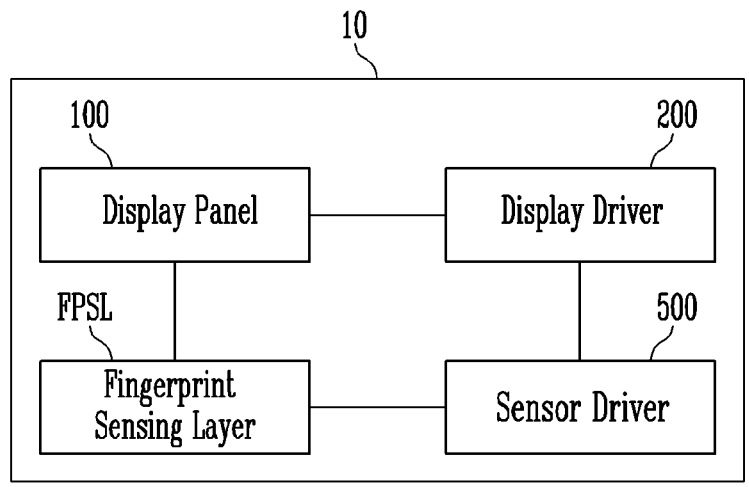
FIG. 9 is a block diagram illustrating the display device according to an embodiment.

FIG. 9 is a block diagram illustrating the display device according to an embodiment.

Referring to FIG. 9, the display device 10 may include the display panel 100, the display driver 200, the fingerprint sensor layer FPSL, and the sensor driver 500.

The display driver 200 may supply an image driving signal to the display panel 100 to control an image display operation of the display panel 100. The display driver 200 may generate the image driving signal according to (e.g., based on) video data (e.g., digital video data) and a timing signal, which may be externally supplied (e.g., supplied from the outside). For example, the display driver 200 may receive the digital video data and the timing signal from a host device (e.g., a host processor), and the timing signal may include a vertical synchronization signal, a horizontal synchronization signal, a clock signal, and/or the like. In addition, the image driving signal may include a scan signal, an emission signal, a data signal, and/or the like.

The sensor driver 500 may recognize the fingerprint of the user by controlling an operation of the plurality of fingerprint sensors FPS of the fingerprint sensor layer FPSL. For example, the sensor driver 500 may supply a sensing driving voltage to the plurality of fingerprint sensors FPS, and may receive the read out signal according to the contact (e.g., by the touch) of the finger F. The fingerprint sensor FPS may supply different read out signals to the sensor driver 500 according to (e.g., based on) energy of the light (e.g., the second light L2) reflected from each of the ridge FR and the valley FV of the finger F. The sensor driver 500 may recognize the fingerprint of the user according to (e.g., based on) the read out signal corresponding to each of the plurality of fingerprint pixels FPP of the cover window CW.

Figure 10:
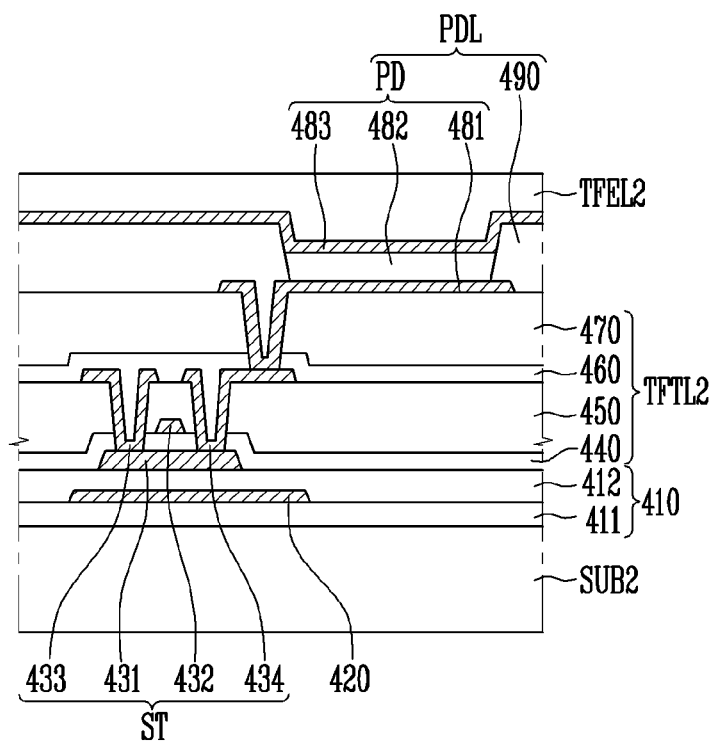
FIG. 10 is a cross-sectional view illustrating a fingerprint sensor layer of the display device according to an embodiment.

FIG. 10 is a cross-sectional view illustrating the fingerprint sensor layer of the display device according to an embodiment. Here, a portion of the fingerprint sensor layer FPSL may be shown in FIG. 10 according to a process of forming the fingerprint sensor layer FPSL before being attached to the display panel 100. For example, in an embodiment, the fingerprint sensor layer FPSL shown in FIG. 10 may be vertically inverted and attached to a lower surface of the display panel 100. As another example, in an embodiment, the fingerprint sensor layer FPSL shown in FIG. 10 may be directly formed on the lower surface of the display panel 100.

Referring to FIG. 10, the fingerprint sensor layer FPSL may include a second substrate SUB2, a buffer layer 410, a second thin film transistor layer TFTL2, a light receiving element layer PDL, and a second thin film encapsulation layer TFTL2.

The second substrate SUB2 may be a base substrate, and may be formed of an insulating material, for example, such as a polymer resin. For example, the second substrate SUB2 may be a flexible substrate capable of bending, folding, rolling, and/or the like. When the second substrate SUB2 is the flexible substrate, the second substrate SUB2 may be formed of polyimide PI, but the present disclosure is not limited thereto.

The buffer layer 410 may include a first buffer layer 411 and a second buffer layer 412. The first buffer layer 411 may be provided on the second substrate SUB2. The first buffer layer 411 may be formed of, for example, an inorganic film capable of preventing or substantially preventing penetration of air and/or moisture. The first buffer layer 411 may be formed of, for example, at least one inorganic film of a silicon nitride layer, a silicon oxy nitride layer, a silicon oxide layer, a titanium oxide layer, and an aluminum oxide layer, but the present disclosure is not limited thereto.

The second buffer layer 412 may be disposed on the first buffer layer 411, and may cover a light blocking pattern 420 that is patterned on the first buffer layer 411. The second buffer layer 412 may be formed of, for example, an inorganic film capable of preventing or substantially preventing penetration of air and/or moisture. For example, the second buffer layer 412 may improve moisture permeability of the fingerprint sensor layer FPSL together with the first buffer layer 411.

The light blocking pattern 420 may be disposed between the first and second buffer layers 411 and 412 to overlap with a switching transistor ST. For example, the light blocking pattern 420 may be formed by depositing a light absorbing material on the first buffer layer 411, and then performing exposure patterning. The light blocking pattern 420 may be formed of a metal, for example, such as molybdenum (Mo), aluminum (Al), chromium (Cr), silver (Ag), or an alloy thereof, but the present disclosure is not limited thereto.

The second thin film transistor layer TFTL2 may be provided on the buffer layer 410. The second thin film transistor layer TFTL2 may include the switching transistor ST (e.g., used for driving) of each of the plurality of fingerprint sensors FPS. The second thin film transistor layer TFTL2 may further include a gate insulating film 440, an interlayer insulating film 450, a protective layer 460, and a planarization layer 470. The switching transistor ST of the fingerprint sensor FPS may include a semiconductor layer 431, a gate electrode 432, a source electrode 433, and a drain electrode 434.

The semiconductor layer 431 may be provided on the buffer layer 410. The semiconductor layer 431 may be disposed to overlap with the gate electrode 432, the source electrode 433, and the drain electrode 434. The semiconductor layer 431 may be in contact with (e.g., in direct contact with) the source electrode 433 and the drain electrode 434, and may face the gate electrode 432 with the gate insulating film 440 interposed therebetween.

The gate electrode 432 may be disposed on the gate insulating film 440. The gate electrode 432 may overlap with the semiconductor layer 431 with the gate insulating film 440 interposed therebetween.

The source electrode 433 and the drain electrode 434 may be spaced apart from each other on the interlayer insulating film 450. The source electrode 433 may be in contact with one end of the semiconductor layer 431 through a first contact hole provided in the gate insulating film 440 and the interlayer insulating film 450. The drain electrode 434 may be in contact with another end of the semiconductor layer 431 through a second contact hole provided in the gate insulating film 440 and the interlayer insulating film 450. The drain electrode 434 may be in contact with (e.g., in direct contact with) a first electrode 481 of a light receiving element PD through a third contact hole of the protective layer 460.

The gate insulating film 440 may be provided on the semiconductor layer 431. For example, the gate insulating film 440 may be disposed on the semiconductor layer 431 and the buffer layer 410, and may insulate the semiconductor layer 431 from the gate electrode 432. The gate insulating film 440 may include the first contact hole through which the source electrode 433 penetrates, and the second contact hole through which the drain electrode 434 penetrates.

The interlayer insulating film 450 may be disposed on the gate electrode 432. For example, the interlayer insulating film 450 may include the first contact hole through which the source electrode 433 penetrates, and the second contact hole through which the drain electrode 434 penetrates. Each of the first contact hole and the second contact hole of the interlayer insulating film 450 may be connected to (e.g., may overlap with) the first contact hole or the second contact hole of the gate insulating film 440.

The protection layer 460 may be provided on the switching transistor ST to protect the switching transistor ST. For example, the protection layer 460 may include a third contact hole through which the first electrode 481 of the light receiving element PD penetrates.

The planarization layer 470 may be provided on the protective layer 460 to planarize or substantially planarize an upper surface of the switching transistor ST. For example, the planarization layer 470 may include the third contact hole through which the first electrode 481 of the light receiving element PD penetrates. Here, the third contact hole of the protective layer 460 and the third contact hole of the planarization layer 470 may be connected to (e.g., may overlap with) each other such that the first electrode 481 of the light receiving element PD penetrates the protective layer 460 and the planarization layer 470 via the third contact hole. In other words, the first electrode 481 of the light receiving element PD may be connected to (e.g., may be in contact with) the drain electrode 434 through the third contact hole.

The light receiving element layer PDL may be provided on the second thin film transistor layer TFTL2. The light receiving element layer PDL may include the light receiving element PD connected to the switching transistor ST of the second thin film transistor layer TFTL2. The light receiving element PD may be disposed so as to not overlap with the light blocking pattern 420.

The light receiving element PD may include the first electrode 481, a light receiving layer 482, and a second electrode 483.

The first electrode 481 may be provided on the planarization layer 470. For example, the first electrode 481 may be disposed to overlap with an opening area of the light receiving element layer PDL defined by a sensor definition film 490. In addition, the first electrode 481 may be in contact with the drain electrode 434 of the switching transistor ST through the third contact hole provided in the planarization layer 470 and the protective layer 460. For example, the first electrode 481 may be formed of a transparent conductive material to transmit the second light L2 reflected by the finger F therethrough, and may serve as an anode of the light receiving element PD.

The light receiving layer 482 may be provided on the first electrode 481. The light receiving layer 482 may include a hole injection layer, a hole transport layer, a light receiving material layer, an electron blocking layer, an electron transport layer, an electron injection layer, and/or the like. For example, the light receiving layer 482 may be an organic light receiving layer including (e.g., formed of) an organic material, but the present disclosure is not limited thereto. When the light receiving layer 482 corresponds to the organic light receiving layer, the organic light receiving layer may receive the second light L2 to combine holes and electrons, and may convert energy of the second light L2 into an electrical signal (e.g., into a current or a voltage) formed between the first electrode 481 and the second electrode 483.

The second electrode 483 may be provided on the light receiving layer 482. For example, the second electrode 483 may be implemented in a form of an electrode that is common to the entire fingerprint sensors FPS, and is not divided among the fingerprint sensors FPS. When a driving voltage is applied to the first electrode 481 and a common voltage is applied to the second electrode 483, the holes and the electrons may move to the light receiving layer 482 and may be combined with each other. The second electrode 483 may serve as a cathode of the light receiving element PD.

The light receiving element layer PDL may include the sensor definition film 490 for defining the plurality of fingerprint sensors FPS. The sensor definition film 490 may be provided on the planarization layer 470. The sensor definition film 490 may be provided between the first electrodes 481 that are adjacent to each other (e.g., in the X-axis direction and/or in the Y-axis direction), and may partition the plurality of first electrodes 481. The second thin film encapsulation layer TFEL2 may be provided on the light receiving element layer PDL. The second thin film encapsulation layer TFEL2 may cover the light receiving element layer PDL, and may prevent or substantially prevent oxygen and/or moisture from penetrating into the light receiving element layer PDL. For example, the second thin film encapsulation layer TFEL2 may include at least one inorganic film. The second thin film encapsulation layer TFEL2 may include an inorganic film, for example, such as a silicon nitride layer, a silicon oxy nitride layer, a silicon oxide layer, a titanium oxide layer, and/or an aluminum oxide layer, but the present disclosure is not limited thereto.

The second thin film encapsulation layer TFEL2 may protect the light receiving element layer PDL from a foreign substance, for example, such as dust. For example, the second thin film encapsulation layer TFEL2 may include at least one organic film. The second thin film encapsulation layer TFEL2 may include an organic film, for example, such as an acrylic resin, an epoxy resin, a phenol resin, a polyamide resin, and/or a polyimide resin, but the present disclosure is not limited thereto.

Figure 11:
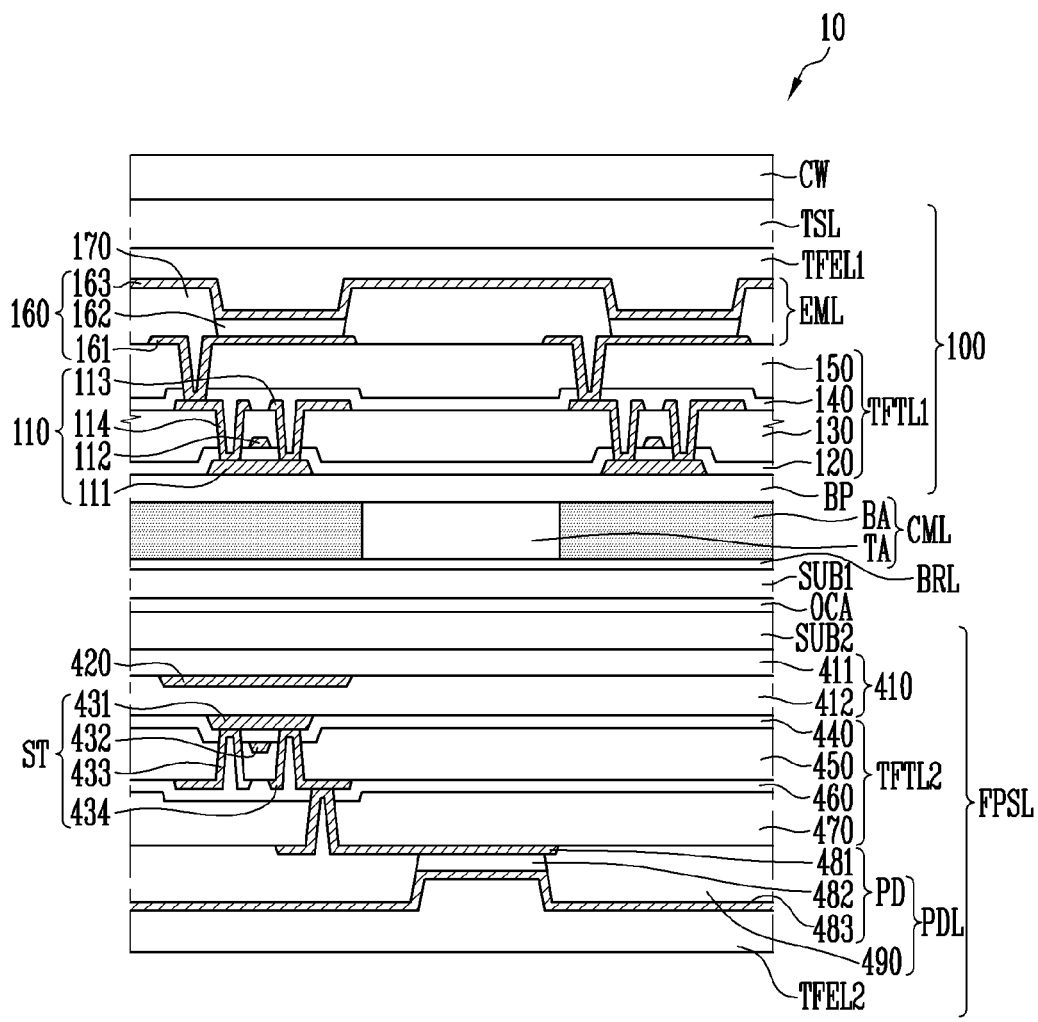
FIG. 11 is a cross-sectional view illustrating the display device in more detail according to an embodiment.
Figure 12:
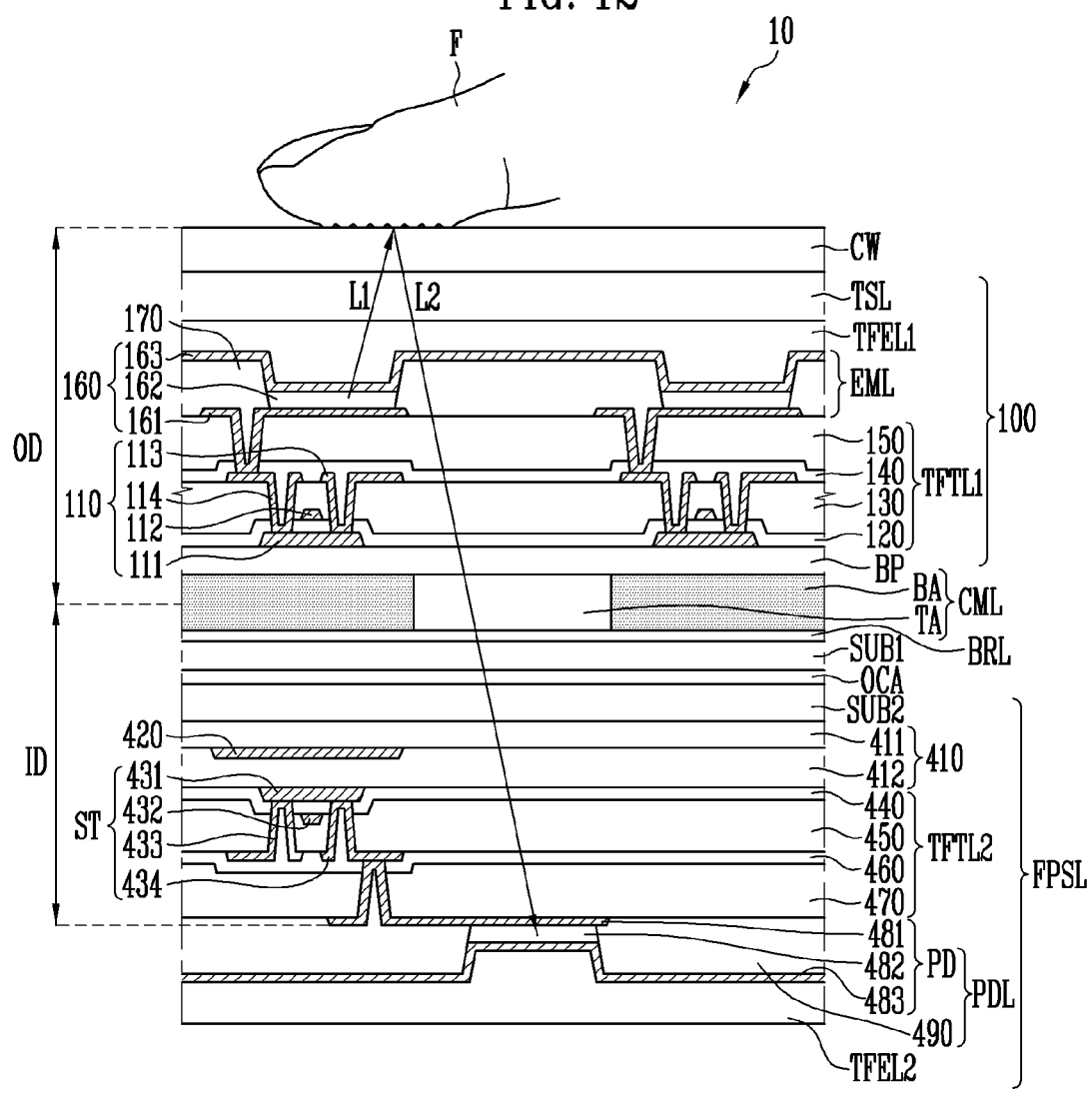
FIG. 12 is a cross-sectional view illustrating a reflection path of light in the display device of FIG. 11.

FIG. 11 is a cross-sectional view illustrating the display device in more detail according to an embodiment. FIG. 12 is a cross-sectional view illustrating a reflection path of light in the display device of FIG. 11. FIGS. 11 and 12 are cross-sectional views illustrating a portion of some example configurations of the display device of FIG. 2 in more detail. Accordingly, redundant description of the same or substantially the same configurations and/or components as those described above may be simplified or may not be repeated.

The fingerprint sensor layer FPSL shown in FIGS. 11 and 12 may be attached to the lower surface of the display panel 100 by vertically inverting the fingerprint sensor layer FPSL of FIG. 10. Referring to FIGS. 11 and 12, the display device 10 may include the first substrate SUB1, the optical pattern layer CML, the display panel 100, the cover window CW, and the fingerprint sensor layer FPSL. The display panel 100 may include the back plane BP, the first thin film transistor layer TFTL1, the light emitting element layer EML, the first thin film encapsulation layer TFEL1, and the touch sensor layer TSL. The fingerprint sensor layer FPSL may include the second substrate SUB2, the buffer layer 410, the second thin film transistor layer TFTL2, the light receiving element layer PDL, and the second thin film encapsulation layer TFTL2.

The optical pattern layer CML may include the plurality of light transmitting patterns TA. The plurality of light transmitting patterns TA may define (e.g., may be) the optical path of the second light L2, which is generated by the first light L1 emitted from the light emitting element layer EML and reflected from the body (e.g., the finger F) of the user, to proceed to the fingerprint sensor layer FPSL. For example, each of the plurality of light transmitting patterns TA may be disposed to overlap with the light receiving layer 482 of the light receiving element PD, but the present disclosure is not limited thereto.

The first thin film transistor layer TFTL1 may be disposed on the back plane BP. The first thin film transistor layer TFTL1 may include at least one thin film transistor 110 of each of the plurality of sub pixels SP for driving the plurality of sub pixels SP.

The first thin film transistor layer TFTL1 may further include a gate insulating film 120, an interlayer insulating film 130, a protective layer 140, and a planarization layer 150. The at least one thin film transistor 110 may include a semiconductor layer 111, a gate electrode 112, a source electrode 113, and a drain electrode 114.

The semiconductor layer 111 may be provided on the back plane BP. The semiconductor layer 111 may be disposed to overlap with the gate electrode 112, the source electrode 113, and the drain electrode 114. The semiconductor layer 111 may be in contact with (e.g., in direct contact with) the source electrode 113 and the drain electrode 114, and may face the gate electrode 112 with the gate insulating film 120 interposed therebetween.

The gate electrode 112 may be disposed on the gate insulating film 120. The gate electrode 112 may overlap with the semiconductor layer 111 with the gate insulating film 120 interposed therebetween.

The source electrode 113 and the drain electrode 114 may be spaced apart from each other on the interlayer insulating film 130. The source electrode 113 may be in contact with one side of the semiconductor layer 111 through a contact hole provided in the gate insulating film 120 and the interlayer insulating film 130. The drain electrode 114 may be in contact with another side of the semiconductor layer 111 through another contact hole provided in the gate insulating film 120 and the interlayer insulating film 130. The drain electrode 114 may be contact with (e.g., in direct contact with) a first electrode 161 of the light emitting element 160 through a contact hole of the protective layer 140.

The gate insulating film 120 may be provided on the semiconductor layer 111. For example, the gate insulating film 120 may be disposed on the semiconductor layer 111 and the back plane BP, and may insulate the semiconductor layer 111 from the gate electrode 112. The gate insulating film 120 may include the contact hole through which the source electrode 113 penetrates and the contact hole through which the drain electrode 114 penetrates.

The interlayer insulating film 130 may be disposed on the gate electrode 112. For example, the interlayer insulating film 130 may include the contact hole through which the source electrode 113 penetrates, and the contact hole through which the drain electrode 114 penetrates. Here, the contact holes of the interlayer insulating film 130 may be connected to (e.g., may overlap with) the contact holes of the gate insulating film 120.

The protective layer 140 may be provided on the thin film transistor 110 to protect the thin film transistor 110. For example, the protective layer 140 may include a contact hole through which the first electrode 161 of the light emitting element 160 penetrates.

The planarization layer 150 may be provided on the protective layer 140 to planarize or substantially planarize an upper surface of the thin film transistor 110. For example, the planarization layer 150 may include a contact hole through which the first electrode 161 of the light emitting element 160 penetrates. Here, the contact hole of the protective layer 140 and the contact hole of the planarization layer 150 may be connected to (e.g., may overlap with) each other such that the first electrode 161 of the light emitting element 160 penetrates therethrough.

The light emitting element layer EML may be provided on the first thin film transistor layer TFTL1. The light emitting element layer EML may include the light emitting element 160 connected to the thin film transistor 110 of the first thin film transistor layer TFTL1.

The light emitting element 160 may include the first electrode 161, a light emitting layer 162, and a second electrode 163.

The first electrode 161 may be provided on the planarization layer 150. For example, the first electrode 161 may be disposed to overlap with the opening area of the light emitting element layer EML defined by the pixel definition film 170. The first electrode 161 may be in contact with the drain electrode 114 of the thin film transistor 110 through the contact hole provided in the planarization layer 150 and the protection layer 140. For example, the first electrode 161 may serve as an anode of the light emitting element 160.

The light emitting layer 162 may be provided on the first electrode 161. The light emitting layer 162 may include a hole injection layer, a hole transport layer, a light receiving layer, an electron blocking layer, an electron transport layer, an electron injection layer, and/or the like. For example, the light emitting layer 162 may be an organic light emitting layer including (e.g., formed of) an organic material, but the present disclosure is not limited thereto. In a case where the light emitting layer 162 corresponds to the organic light emitting layer, a desired or suitable voltage (e.g., a predetermined voltage) may be applied to the first electrode 161 of the light emitting element 160, and a common voltage or a cathode voltage may be applied to the second electrode 163 of the light emitting element 160, such that the light emitting layer 162 emits light. For example, when the voltages are applied to the first and second electrodes 161 and 163 of the light emitting element 160, each of the holes and the electrons may move to the organic light emitting layer 162 through the hole transport layer, and the holes and the electrons may be combined with each other in the organic light emitting layer 162 to emit light.

The second electrode 163 may be provided on the light emitting layer 162. For example, the second electrode 163 may be implemented in a form of an electrode that is not divided by the sub pixels SP, and may be common to the entire sub pixels SP.

The light emitting element layer EML may include the pixel definition film 170 for defining the plurality of sub pixels SP. The first thin film encapsulation layer TFEL1, the touch sensor layer TSL, the cover window CW, and the fingerprint sensor layer FPSL may be the same or substantially the same as those described with reference to FIGS. 2 and 10, and thus, redundant description thereof may not be repeated.

According to one or more example embodiments described above, the display device 10 may minimize or reduce damage of the first substrate SUB1 in a process of forming the optical pattern layer CML by disposing the barrier layer BRL between the first substrate SUB1 and the optical pattern layer CML. Therefore, an optical characteristic may be improved, and/or device durability may be improved.

Hereinafter, another embodiment of the display device will be described. In the following embodiment, the same or substantially the same configurations and/or components as those of the one or more embodiments described above may be denoted by the same reference symbols, and thus, redundant description thereof may be simplified or may not be repeated.

Figure 13:
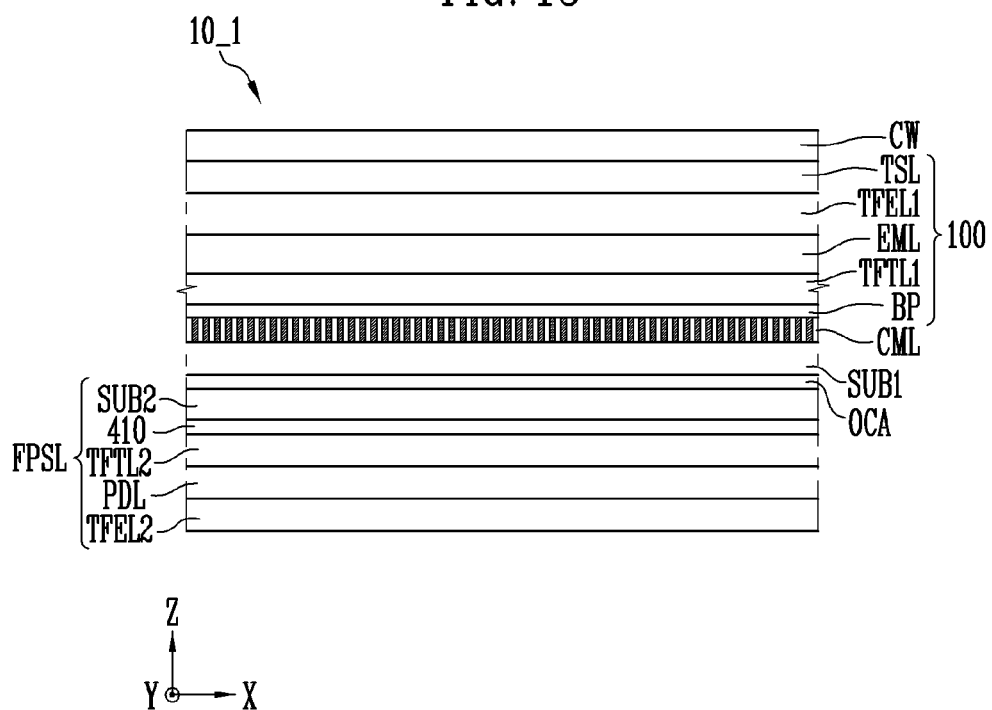
FIG. 13 is a cross-sectional view illustrating the display device in more detail according to another embodiment.

FIG. 13 is a cross-sectional view illustrating the display device 10_1 in more detail according to another embodiment. The display device 10_1 of FIG. 13 may be different from the display device 10 of FIG. 2 in that the barrier layer BRL may be omitted.

Referring to FIG. 13, the optical pattern layer CML may be disposed on (e.g., may be directly disposed on) the first substrate SUB1. The upper surface (e.g., one surface) of the first substrate SUB1 may face the lower surface (e.g., another surface) of the optical pattern layer CML. The upper surface (e.g., the one surface) of the first substrate SUB1 may be in contact with (e.g., in direct contact with) the lower surface (e.g., the other surface) of the optical pattern layer CML.

In this case, in an embodiment, the display device 10_1 may protect the first substrate SUB1 by a hard mask and/or the like during a process of forming the optical pattern layer CML, even though a barrier layer (e.g., the barrier layer BRL) is omitted between the first substrate SUB1 and the optical pattern layer CML. In other words, because damage to the first substrate SUB1 may be minimized or reduced, an optical characteristic may be improved and/or an element durability may be improved. Detailed description thereof will be described below with reference to FIGS. 20 to 26.

A method of manufacturing a display device according to one or more example embodiments described above will be described hereinafter.

FIGS. 14 to 19 are cross-sectional views of one or more processes of the method of manufacturing the display device according to an embodiment. FIGS. 14 to 19 are cross-sectional views illustrating the method of manufacturing the display device of FIGS. 1 to 12. Accordingly, the components and/or configurations shown in FIGS. 14-19 that are the same or substantially the same as those of FIGS. 1 to 12 may be denoted by the same reference symbols, and thus, detailed reference symbols thereof may be omitted and redundant description thereof may be simplified or may not be repeated.

Figure 14:
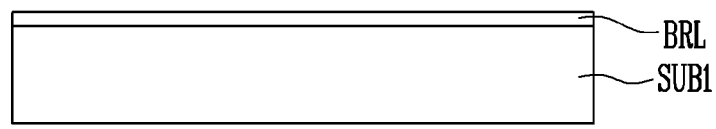
FIGS. 14-19 are cross-sectional views of one or more processes of a method of manufacturing the display device according to an embodiment.

Referring to FIG. 14, in an embodiment, the barrier layer BRL may be formed on the first substrate SUB1. The barrier layer BRL may be formed, for example, by a plasma chemical vapor deposition (PECVD) process. The barrier layer BRL may include (e.g., may be formed of) an inorganic film, for example, such as a silicon nitride layer, a silicon oxy nitride layer, a silicon oxide layer, a titanium oxide layer, and/or an aluminum oxide layer, but the present disclosure is not limited thereto. In this case, damage to the first substrate SUB1 may be reduced or minimized in a subsequent process by forming the barrier layer BRL on the first substrate SUB1. In other words, element durability may be improved.

Figure 15:
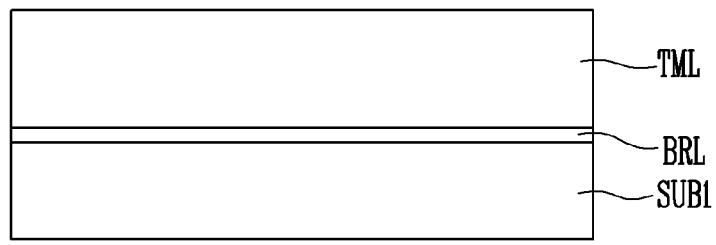

Referring to FIG. 15, a light transmitting material layer TML may be formed on the barrier layer BRL. The light transmitting material layer TML may be formed, for example, by an inkjet printing process or a spin coating process using, for example, an acrylic resin, an epoxy resin, a phenolic resin, a polyamides resin, a polyimides resin, an unsaturated polyesters resin, a poly phenylenethers resin, a polyphenylenesulfides resin, and/or benzocyclobutene (BCB), but the present disclosure is not limited thereto.

Figure 16:
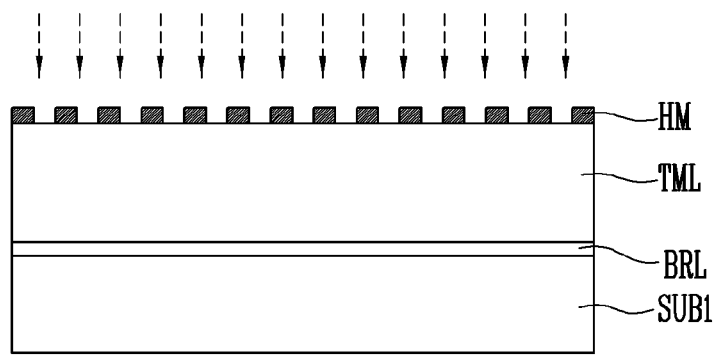
Figure 17:
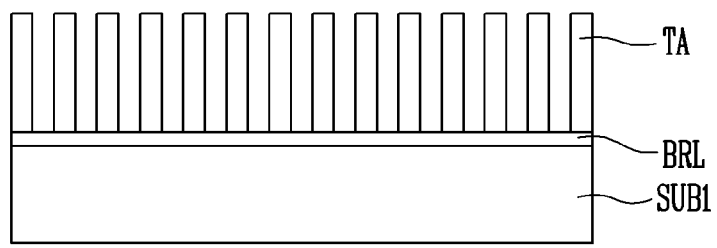

Referring to FIGS. 16 and 17, a hard mask HM may be formed on the light transmitting material layer TML, and the light transmitting material layer TML may be etched to form the plurality of light transmitting patterns TA. For example, the hard mask HM may be formed at a position defining the light transmitting pattern TA.

Even though the light transmitting material layer TML may be formed using an etching process, the first substrate SUB1 may be protected by the barrier layer BRL. Therefore, because an etching process margin may be increased, a process condition may be diversified. In addition, because various models of the light transmitting pattern TA may be applied, such as the decrease of the line width of the light transmitting pattern TA or the increase of the thickness of the light transmitting pattern TA, fingerprint recognition performance may be improved.

Figure 18:
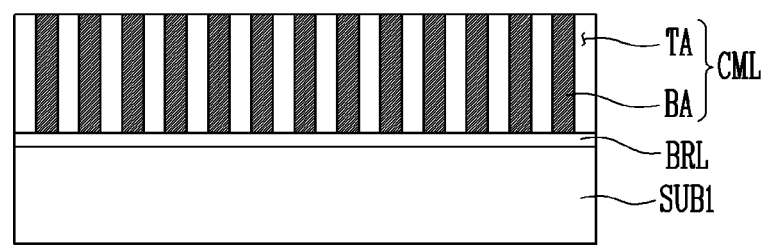

Referring to FIG. 18, a light blocking material layer may be formed in spaces between the plurality of light transmitting patterns TA to form the light blocking pattern BA. The light blocking pattern BA may be directly formed on the barrier layer BRL. In other words, because the first substrate SUB1 may be protected by the barrier layer BRL, out-gassing that may occur between the light blocking pattern BA and the first substrate SUB1 may be prevented or reduced. The light blocking pattern BA may be formed using, for example, an organic light blocking material and a metal light blocking material. For example, the organic light blocking material may include at least one of carbon black (CB) and titanium black (TiBK), but the present disclosure is not limited thereto. The metal light blocking material may include, for example, at least one of chromium, chromium oxide, and chromium nitride, but the present disclosure is not limited thereto. The light blocking pattern may be formed, for example, by an inkjet printing process or a spin coating process using, for example, an acrylic resin, an epoxy resin, a phenolic resin, a polyamides resin, a polyimides resin, an unsaturated polyesters resin, a poly phenylenethers resin, a polyphenylenesulfides resin, and/or benzocyclobutene (BCB), but the present disclosure is not limited thereto.

Figure 19:
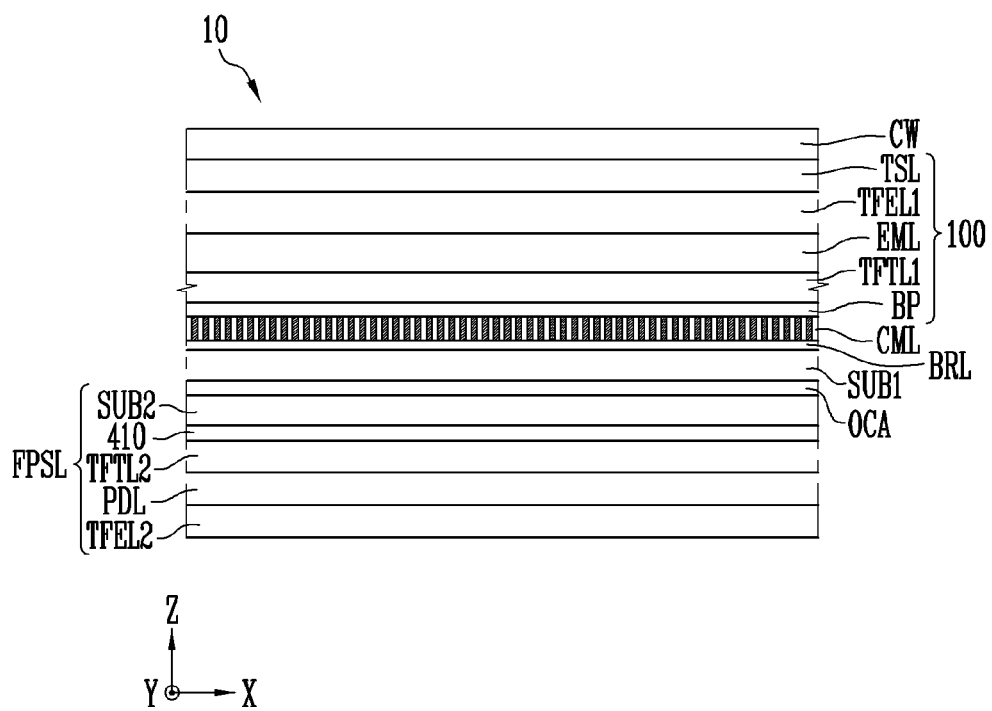

Referring to FIG. 19, in an embodiment, the fingerprint sensor layer FPSL may be formed under (e.g., underneath) the first substrate SUB1, and the display panel 100 may be formed on the optical pattern layer CML to manufacture the display device 10 shown in FIG. 2, for example.

In an embodiment, according to the method of manufacturing the display device described above, damage to the first substrate SUB1 that may occur in a subsequent process may be reduced or minimized by forming the barrier layer BRL on the first substrate SUB1.

Therefore, because the etching process margin may be increased, the process condition may be diversified. In addition, because the various models of the light transmitting pattern TA may be applied, for example, such as the decrease of the line width of the light transmitting pattern TA or the increase of the thickness of the light transmitting pattern TA, the fingerprint recognition performance may be improved.

Further, because the barrier layer BRL may be disposed between the first substrate SUB1 and the optical pattern layer CML, out-gassing that may occur between the first substrate SUB1 and the optical pattern layer CML may be reduced or prevented. Therefore, the optical characteristic and/or the element durability may be improved.

Hereinafter, a method of manufacturing the display device according to another embodiment will be described.

FIGS. 20 to 26 are cross-sectional views of one or more processes of the method of manufacturing the display device according to another embodiment. FIGS. 20 to 26 are cross-sectional views illustrating the method of manufacturing the display device of FIG. 13. Accordingly, components and/or configurations shown in FIGS. 20 to 26 that are the same or substantially the same as those of FIG. 13 may be denoted by the same reference symbols, and thus, detailed reference symbols thereof may be omitted and redundant description thereof may be simplified or may not be repeated.

Figure 20:
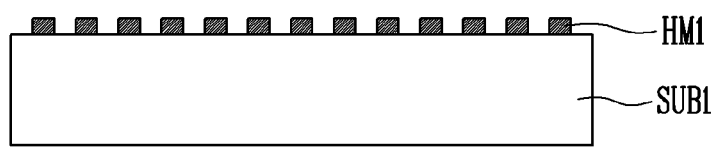
FIGS. 20-26 are cross-sectional views of one or more processes of the method of manufacturing the display device according to another embodiment.

Referring to FIG. 20, in an embodiment, a first hard mask HM1 may be formed on the first substrate SUB1. The first hard mask HM1 may be formed, for example, at a position defining the light blocking pattern BA. In this case, damage to the first substrate SUB1 may be reduced or minimized in a subsequent process by forming the first hard mask HM1 on the first substrate SUB1. In other words, as described above, element durability may be improved.

Figure 21:
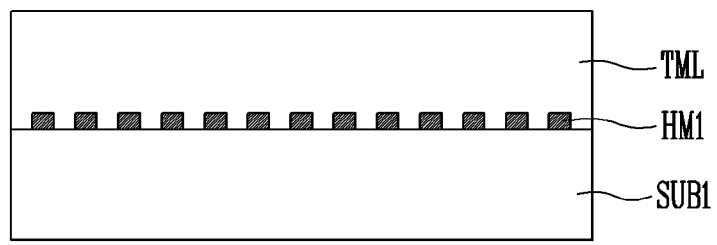

Referring to FIG. 21, in an embodiment, the light transmitting material layer TML may be formed on the first substrate SUB1 and the first hard mask HM1. The light transmitting material layer TML may be formed using the same or substantially the same process (e.g., or a similar process) as that described above with reference to FIG. 15, and thus, redundant description thereof may not be repeated.

Figure 22:
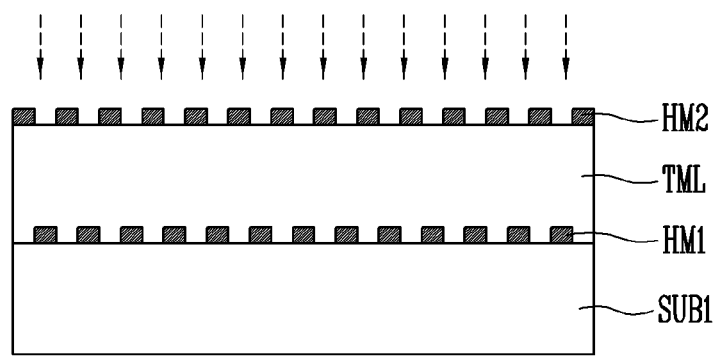
Figure 23:
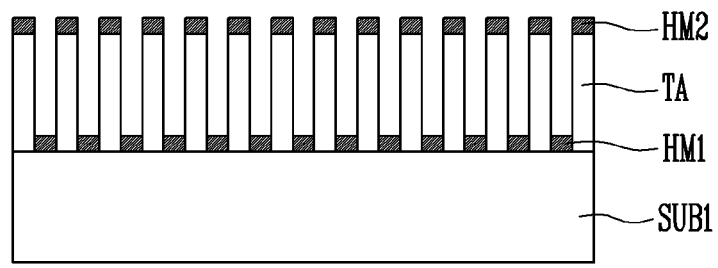

Referring to FIGS. 22 and 23, in an embodiment, a second hard mask HM2 may be formed on the light transmitting material layer TML, and the light transmitting material layer TML may be etched to form the plurality of light transmitting patterns TA. The second hard mask HM2 may be formed, for example, at a position defining the light transmitting pattern TA. In other words, the second hard mask HM2 may overlap with an opening portion of the first hard mask HM1. Even though the light transmitting material layer TML may be formed in an etching process, the first substrate SUB1 may be protected by the first hard mask HM1. Therefore, because the etching process margin may be increased, a process condition may be diversified. In addition, because various models of the light transmitting pattern TA may be applied, for example, such as the decrease of the line width of the light transmitting pattern TA or the increase of the thickness of the light transmitting pattern TA, the fingerprint recognition performance may be improved as described above.

Figure 24:
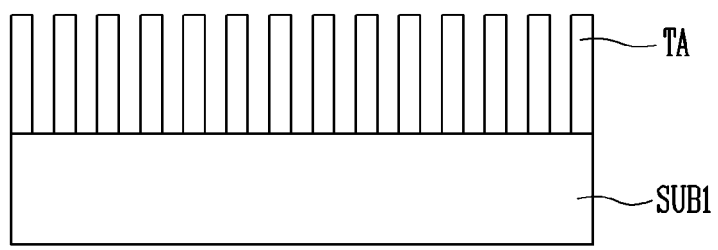

Referring to FIG. 24, in an embodiment, the first hard mask HM1 and the second hard mask HM2 may be removed. In another embodiment, the first hard mask HM1 and the second hard mask HM2 may be transparent hard masks. When the first hard mask HM1 and the second hard mask HM2 are transparent hard masks, the first hard mask HM1 and the second hard mask HM2 may or may not be removed.

Figure 25:
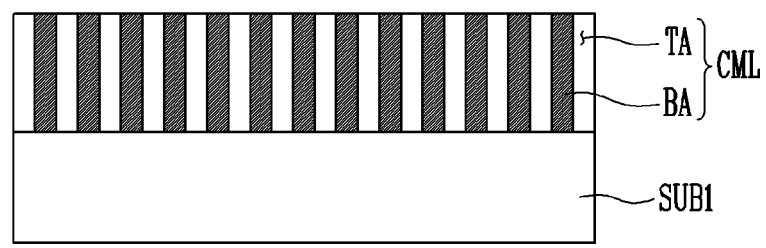

Referring to FIG. 25, the light blocking material layer may be formed in spaces between the plurality of light transmitting patterns TA to form the light blocking pattern BA. Because the process of forming the light blocking pattern BA may be the same or substantially the same as (e.g., or similar to) that described above with reference to FIG. 18, redundant description thereof may not be repeated.

Figure 26:
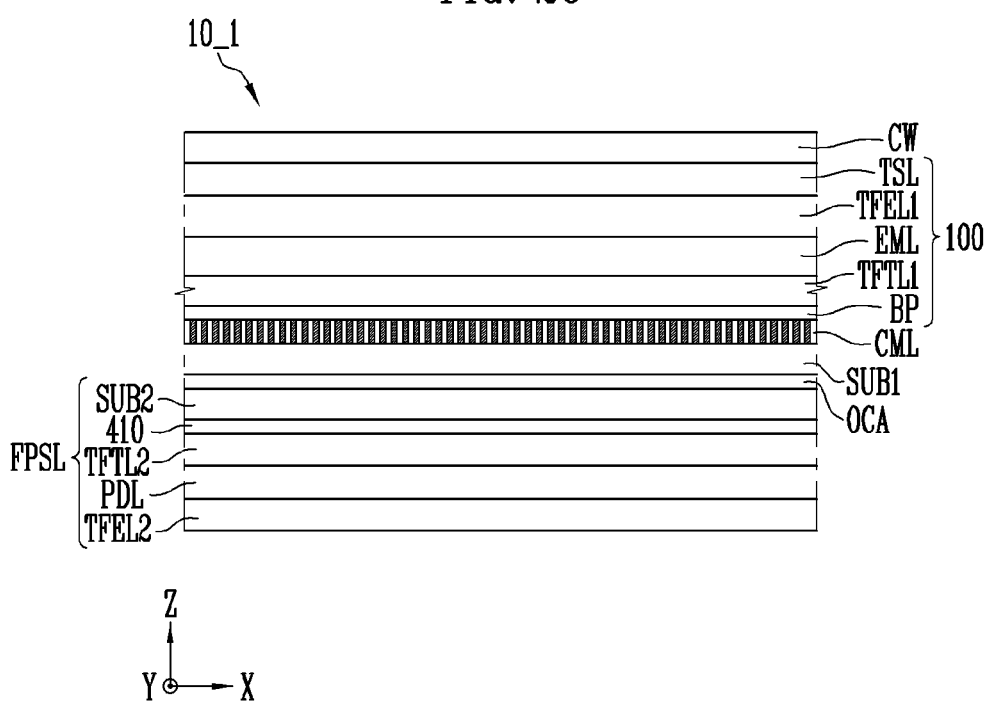

Referring to FIG. 26, in an embodiment, the fingerprint sensor layer FPSL may be formed under (e.g., underneath) the first substrate SUB1, and the display panel 100 may be formed on the optical pattern layer CML to manufacture the display device 10_1 shown in FIG. 13, for example.

In an embodiment, according to the method of manufacturing the display device described above, damage to the first substrate SUB1 that may occur in a subsequent process may be reduced or minimized by forming the first hard mask HM1 on the first substrate SUB1. Therefore, the optical characteristic and/or the element durability may be improved.

In addition, because the etching process margin may be increased, the process condition may be diversified. Further, because various models of the light transmitting pattern TA may be applied, for example, such as the decrease of the line width of the light transmitting pattern TA or the increase of the thickness of the light transmitting pattern TA, the fingerprint recognition performance may be improved as described above.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
a first substrate;
a barrier layer on the first substrate;
an optical pattern layer on the barrier layer, and comprising a light blocking pattern, and a plurality of light transmitting patterns penetrating the light blocking pattern in a first direction;
a first thin film transistor layer on the optical pattern layer, and comprising a thin film transistor;
a light emitting element layer on the first thin film transistor layer; and
a fingerprint sensor layer underneath the first substrate to receive light reflected from an external object,
wherein the thin film transistor overlaps with the light blocking pattern, and the plurality of light transmitting patterns do not overlap with the thin film transistor, and
wherein the fingerprint sensor layer comprises a light receiving element layer, and a second thin film transistor layer between the first substrate and the light receiving element layer.

2. The display device according to claim 1, wherein one surface of the barrier layer is in direct contact with the first substrate, and another surface of the barrier layer is in direct contact with the light blocking pattern and the plurality of light transmitting patterns.

3. The display device according to claim 1, wherein the barrier layer comprises at least one of SiOx, SiNx, and SiON.

4. The display device according to claim 1, wherein the barrier layer comprises at least one of ITO, IZO, and IGZO.

5. The display device according to claim 1, wherein an aspect ratio of a light transmitting pattern from among the plurality of light transmitting patterns is defined by a height of the light transmitting pattern divided by a line width of the light transmitting pattern, the line width of the light transmitting pattern corresponding to a length of the light transmitting pattern in a second direction crossing the first direction, and the aspect ratio is greater than or equal to 7.

6. The display device according to claim 1, wherein the fingerprint sensor layer comprises:
the second thin film transistor layer underneath the first substrate;
the light receiving element layer electrically connected to the second thin film transistor layer; and
a second thin film encapsulation layer covering the light receiving element layer.

7. The display device according to claim 6, wherein the light receiving element layer comprises a photo transistor or a photo diode.

8. The display device according to claim 1, wherein the fingerprint sensor layer is attached to a lower portion of the first substrate through a transparent adhesive member.

9. The display device according to claim 1, further comprising:
a first thin film encapsulation layer on the light emitting element layer; and
a cover window on the first thin film encapsulation layer.

10. The display device according to claim 9, further comprising:
a touch sensing layer between the first thin film encapsulation layer and the cover window.

11. A display device comprising:
a first substrate;
a barrier layer on the first substrate;
an optical pattern layer on the barrier layer, and comprising a light blocking pattern, and a plurality of light transmitting patterns penetrating the light blocking pattern in a first direction;
a first thin film transistor layer on the optical pattern layer;
a light emitting element layer on the first thin film transistor layer; and
a fingerprint sensor layer underneath the first substrate to receive light reflected from an external object,
wherein the fingerprint sensor layer comprises:
a second thin film transistor layer underneath the first substrate;
a light receiving element layer electrically connected to the second thin film transistor layer; and
a second thin film encapsulation layer covering the light receiving element layer, and
wherein the light receiving element layer comprises:
a first electrode electrically connected to the second thin film transistor layer;
a second electrode on the first electrode to receive a common voltage; and
a light receiving layer between the first electrode and the second electrode.

12. The display device according to claim 11, wherein the light receiving layer overlaps with a corresponding light transmitting pattern from among the plurality of light transmitting patterns in the first direction.

13. The display device according to claim 11, wherein the light reflected from the external object passes through a corresponding light transmitting pattern from among the plurality of light transmitting patterns and the barrier layer to be provided to the light receiving layer.

* * * * *